(12) United States Patent
Yamazaki et al.

(10) Patent No.: US 7,326,604 B2
(45) Date of Patent: Feb. 5, 2008

(54) SEMICONDUCTOR DEVICE AND METHOD OF MANUFACTURING THE SAME

(75) Inventors: Shunpei Yamazaki, Tokyo (JP); Hisashi Ohtani, Kanagawa (JP); Akiharu Miyanaga, Kanagawa (JP); Toru Mitsuki, Kanagawa (JP); Takeshi Fukunaga, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 93 days.

(21) Appl. No.: 10/765,952

(22) Filed: Jan. 29, 2004

(65) Prior Publication Data

US 2004/0183132 A1 Sep. 23, 2004

Related U.S. Application Data

(62) Division of application No. 09/115,094, filed on Jul. 13, 1998, now Pat. No. 6,693,299.

(30) Foreign Application Priority Data

Jul. 14, 1997 (JP) .................................. 09-205347

(51) Int. Cl.
*H01L 21/84* (2006.01)
(52) U.S. Cl. ................ 438/166; 438/476; 257/E21.561
(58) Field of Classification Search ........ 438/151–166, 438/476; 257/E21.561
See application file for complete search history.

(56) References Cited

U.S. PATENT DOCUMENTS

| 5,164,805 | A | 11/1992 | Lee |
|---|---|---|---|
| 5,210,437 | A | 5/1993 | Sawada et al. |
| 5,753,544 | A | 5/1998 | Cho et al. |
| 5,821,138 | A * | 10/1998 | Yamazaki et al. .......... 438/166 |
| 5,843,811 | A * | 12/1998 | Singh et al. ................ 438/166 |
| 5,894,137 | A | 4/1999 | Yamazaki et al. |
| 5,952,699 | A | 9/1999 | Yamazaki et al. |
| 6,107,654 | A | 8/2000 | Yamazaki |
| 6,111,296 | A | 8/2000 | Yamazaki et al. |
| 6,118,148 | A | 9/2000 | Yamazaki |
| 6,127,702 | A | 10/2000 | Yamazaki |
| 6,184,556 | B1 | 2/2001 | Yamazaki et al. |
| 6,198,141 | B1 | 3/2001 | Yamazaki et al. |
| 6,218,714 | B1 | 4/2001 | Yamazaki |
| 6,232,642 | B1 | 5/2001 | Yamazaki |
| 6,251,733 | B1 | 6/2001 | Yamazaki |
| 6,306,709 | B1 | 10/2001 | Miyagi et al. |
| 6,307,220 | B1 | 10/2001 | Yamazaki |
| 6,498,376 | B1 | 12/2002 | Miyagi et al. |
| 6,590,230 | B1 | 7/2003 | Yamazaki et al. |
| 6,653,687 | B1 | 11/2003 | Yamazaki |

FOREIGN PATENT DOCUMENTS

| JP | 60-134468 | 7/1985 |
|---|---|---|
| JP | 62-248255 | 10/1987 |

(Continued)

*Primary Examiner*—Richard A. Booth
(74) *Attorney, Agent, or Firm*—Fish & Richardson P.C.

(57) ABSTRACT

In a semiconductor device using a crystalline semiconductor film on a substrate 106 having an insulating surface, impurities are locally implanted into an active region 102 to form a pinning region 104. The pinning region 104 suppresses the spread of a depletion layer from the drain side to effectively prevent the short channel effect. Also, since a channel forming region 105 is intrinsic or substantially intrinsic, a high mobility is realized.

14 Claims, 14 Drawing Sheets

FOREIGN PATENT DOCUMENTS

| | | |
|---|---|---|
| JP | 8-032081 | 2/1996 |
| JP | 08-102543 | 4/1996 |
| JP | 08-274330 | 10/1996 |
| JP | 08-293598 | 11/1996 |
| JP | 08288522 | * 11/1996 |
| WO | 88/03328 A1 | 5/1988 |

* cited by examiner

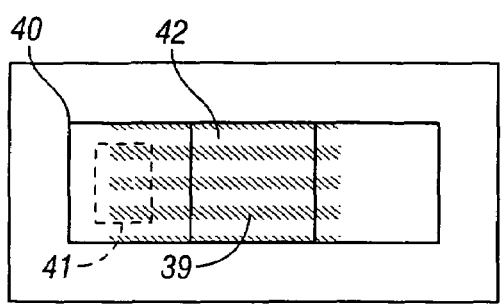 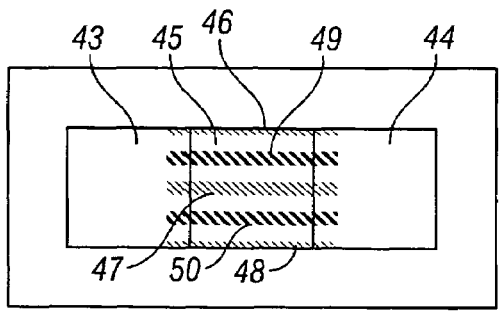
FIG. 13  FIG. 14
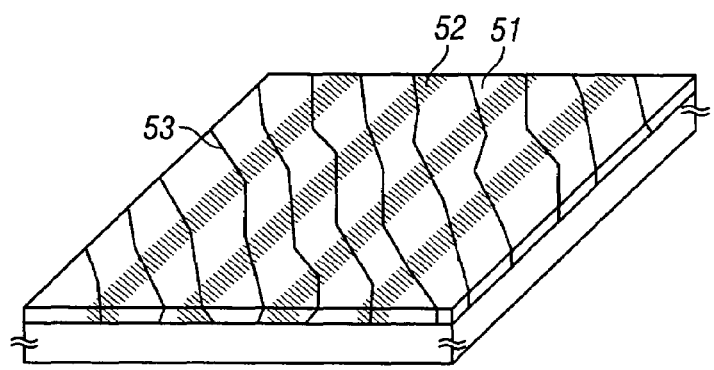
FIG. 15A
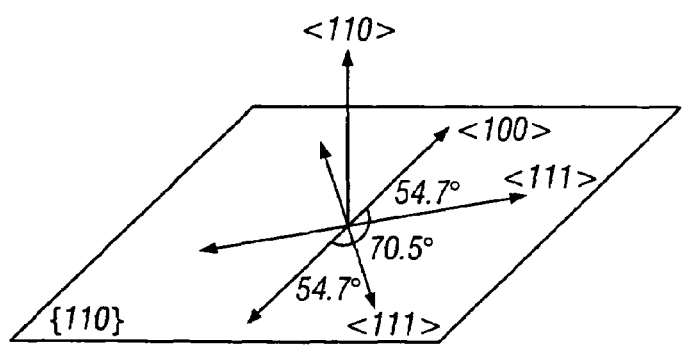
FIG. 15B

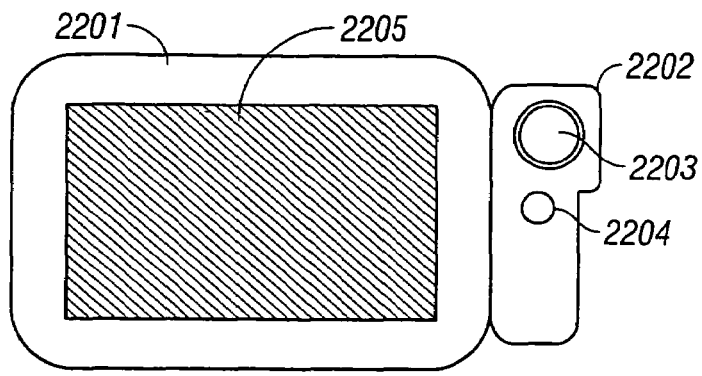
FIG. 19C
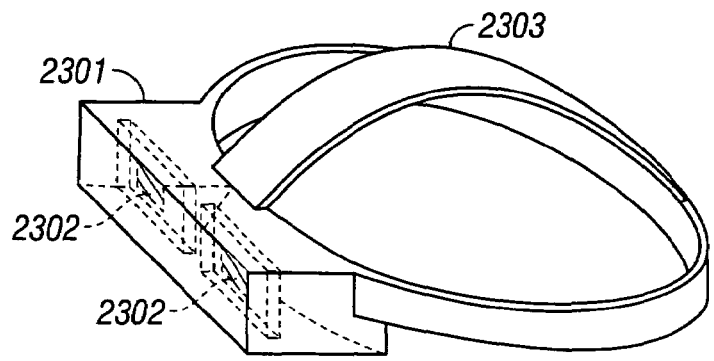
FIG. 19D
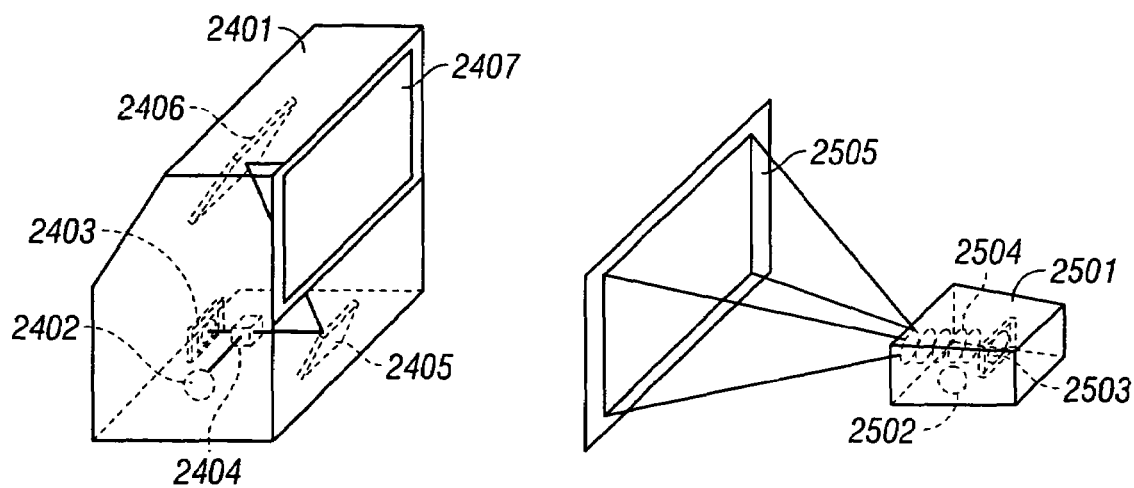
FIG. 19E  FIG. 19F

SEMICONDUCTOR DEVICE AND METHOD OF MANUFACTURING THE SAME

CROSS-REFERENCE TO RELATED APPLICATIONS

This application is a divisional application of U.S. application Ser. No. 09/115,094, filed on Jul. 13, 1998, now U.S. Pat. No. 6,693,299, which claims the benefit from a foreign priority application filed in Japan on Jul. 14, 1997 as serial no. 09-205347. This application claims priority to both of these prior applications, and the disclosures of the prior applications are considered part of (and are incorporated by reference in) the disclosure of this application.

BACKGROUND OF THE INVENTION

1. Field of the Invention

The present invention relates to a semiconductor device using a crystalline semiconductor thin film, and more particularly to the structure of an insulating gate thin film transistor (TFT). Also, the present invention relates to the structure of a semiconductor circuit, a display unit formed of TFTs, an electro-optic device composing them, and so on.

In the present specification, all of the above TFT, the semiconductor circuit, the electro-optic device and the electronic device belong to semiconductor devices. That is, all of devices which can function using a semiconductor characteristic are called "semiconductor device". Accordingly, the semiconductor device of the present invention includes not only a single device such as a TFT but also a semiconductor circuit having the single device integrated or an electro-optic device and an electronic device on which such semiconductor circuit and electro-optic device are mounted as components.

2. Description of the Related Art

In recent years, a study relating to a thin film transistor has been advanced at a very high speed. Initially, the thin film transistor had been employed as a pixel switch of the active matrix display unit, but a large amount of study makes the performance of the thin film transistor progressively improve so that the performance of the thin film transistor attains to a stage where an integrated circuit having the performance equal to the conventional IC can be formed at presence.

The existing VLSI and ULSI have a tendency to go on fining the device size to demand further improvement in the integration. The tendency is applied to the TFT, and at presence, there have been demanded such a TFT that its channel length (L) is 1 µm or less and further 0.2 µm or less.

On the other hand, there has been known a phenomenon called "short-channel effect" as a factor of preventing the fining in the field of MOSFET. The short-channel effect is directed to various problems such as the deterioration of withstand voltages between a source and a drain of the MOSFET, the deterioration of a threshold value voltage which are induced as the channel length is shortened (refer to Submicron Device I: pp. 88-138, Mitsumasa Koyanagi, et al., Maruzen Kabushiki Kaisha, 1987).

According to this reference book, a punch-through phenomenon has been most well known as one of factors of deteriorating the withstand voltage. This phenomenon is a phenomenon that a potential influence of the shortened channel length on a drain side depletion layer comes to a source side, to thereby lower a diffusion potential of the source side (drain induction barrier lowering phenomenon), with the result that it becomes difficult to control carriers by controlling the gate voltage.

This short-channel effect brings the same problem to TFT which should be overcome to conduct fining. Hereinafter, the mechanism of generating the short-channel effect will be described with reference to a schematic diagram of FIGS. 2A to 2C.

In FIG. 2A, reference numeral 201 denotes a substrate having an insulating surface; 202 is a source region; 203 is a drain region, 204 is a pair of low-concentration impurity regions (LDD regions), and 205 is a channel forming region. Those regions 202 to 205 are formed of crystalline semiconductor layers. Also, reference numeral 206 denotes a gate insulating film, and 207 is a gate electrode.

What pays attention to the channel forming region 205 in FIG. 2A is a schematic diagram shown in FIG. 2B. In FIG. 2B, a shaded portion indicated by reference numeral 208 is a depletion layer that spreads in the channel forming region.

If usual (in the case where the channel length is long), the depletion layer having a uniform depth is formed under a channel formed directly under the gate electrode 207. However, as the channel length (L) is extremely shortened, the depletion layer extending from the drain side spreads toward the source region so as to be in contact with the depletion layer of the source side (FIG. 2B).

As a result, the potential barrier in the vicinity of the source is drawn down by the drain voltage so that a current is allowed to freely flow even in a state where the voltage is not applied to the gate. In this case, an energy band between the source and the drain is continuously varied as shown in FIG. 2C. This is a punch-through phenomenon that leads to the drop of a withstand voltage between the source and the drain.

Also, the representative example of the short-channel effect is the drop of a threshold value voltage. It is presumed that this is also induced by the spread of the depletion layer.

Various countermeasures have been conducted on the above-described short-channel effect, and the most general countermeasure is a channel doping. The channel doping is a technique in which a slight amount of impurity elements such as P (phosphorus) or B (boron) are added to a shallow degree to the entire channel forming region to suppress the short-channel effect (see Japanese Patent Laid-open Publication No. Hei 4-206971, Japanese Patent Laid-open Publication No. Hei 4-286339, etc.).

The channel doping is conducted for the purpose of controlling the threshold value voltage and suppressing the punch-through. However, the channel doping technique has such a defect that a large limit is given to the electric field effect mobility of a TFT (hereinafter, called "mobility"). In other words, the movement of carriers is impeded by the impurity elements intentionally added, to thereby largely lower the carrier mobility.

SUMMARY OF THE INVENTION

The present invention has been made in view of the above problem, and therefore an object of the present invention is to provide a semiconductor device having a completely novel structure which can realize high operation performance (high mobility) and high reliability (high withstand voltage characteristic) together and a method of manufacturing the same.

In order to solve the above problem, according to one aspect of the present invention, there is provided a semiconductor device, comprising:

a crystalline semiconductor film on an insulating surface comprising a source region, a drain region, and an active region; and a gate insulating film and a gate electrode;

wherein said active region includes at least one channel forming region and at least one impurity region shifting an energy band of said crystalline semiconductor thin film; and wherein a depletion layer is deterred from spreading from said drain region toward said source region by the impurity region locally disposed.

Also, according to another aspect of the present invention, there is provided a semiconductor device, comprising:

a crystalline semiconductor film on an insulating surface comprising a source region, a drain region, and an active region; and a gate insulating film and a gate electrode;

wherein said active region includes at least one channel forming region and at least one impurity region shifting an energy band of the crystalline semiconductor film; and wherein a threshold value voltage is controlled by the impurity region locally disposed.

Further, according to still another aspect of the present invention, there is provided a semiconductor device, comprising:

a crystalline semiconductor film on an insulating surface comprising a source region, a drain region, and an active region; and a gate insulating film and a gate electrode;

wherein said active region includes at least one channel forming region and at least one impurity region shifting an energy band of said crystalline semiconductor film; and wherein a depletion layer is deterred from spreading from said drain region toward said source region and a threshold value voltage is controlled by the impurity region locally disposed.

The subject matter of the present invention resides in that the impurity region is locally formed in the active region to suppress the depletion layer that spreads from the drain side to the source side by that impurity region. The active region corresponds to the channel forming region in the conventional TFT, but since the channel forming region and the impurity region are distinguished in the present invention, the active region is defined by the terms "active region" for convenience of description.

Also, the present inventors define the effect of suppressing the depletion layer by the term "pinning" with the meaning of "suppression" since they consider as if the above effect pins the depletion layer. Then, the TFT using the present invention described in the present specification is called "pinning TFT" so as to be clearly distinguishable from the conventional TFT.

According to yet still another aspect of the present invention, there is provided a method of manufacturing a semiconductor device, comprising the steps of:

forming a crystalline semiconductor thin film on an insulating surface; and adding impurity elements that shifts an energy band of said crystalline semiconductor thin film to at least one portion of said crystalline semiconductor film which will come to an active region later to locally form an impurity region;

wherein said impurity region is formed so as to be discontinuous on a joint portion between a channel forming region and a drain region.

According to yet still another aspect of the present invention, there is provided a method of manufacturing a semiconductor device, comprising the steps of:

forming a crystalline semiconductor thin film on a substrate having an insulating surface; and adding impurity elements that shifts an energy band of said crystalline semiconductor thin film to a portion of said crystalline semiconductor thin film which will come to an active region later to locally form an impurity region;

wherein said active region is divided into a plurality of channel forming regions by said impurity region.

The above structure realizes a semiconductor device that can obtain a high operation performance and a high reliability together, which is an object of the present invention. The details of the pinning TFT according to the present invention will be described along various embodiments.

BRIEF DESCRIPTION OF THE DRAWINGS

These and other objects, features and advantages of this invention will become more fully apparent from the following detailed description taken with the accompanying drawings in which:

FIG. 13 is a diagram for explanation of the structure of an active region;

FIG. 14 is a diagram for explanation of the structure of an active region;

FIGS. 15A and 15B are diagrams showing a relation between a pinning region and a grain boundary;

FIGS. 16A to 16C are diagrams showing the structure of a CMOS (invertor) circuit;

FIGS. 19A to 19F are diagrams for explanation of one example of an electronic device, respectively.

DETAILED DESCRIPTION OF THE PREFERRED EMBODIMENTS

Now, a description will be given in more detail of preferred embodiments of the present invention with reference to the accompanying drawings.

Embodiment 1

Figure 1A:
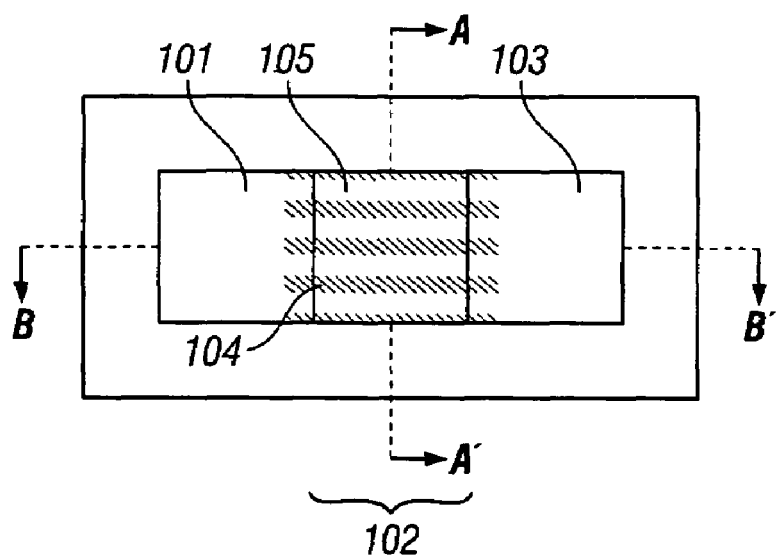
FIGS. 1A to 1C are diagrams for explanation of the outline of a pinning TFT.
Figure 1B:
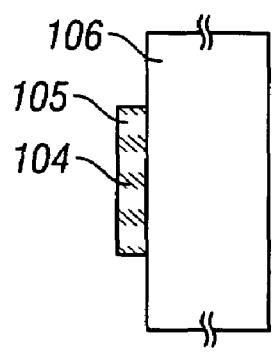
Figure 1C:
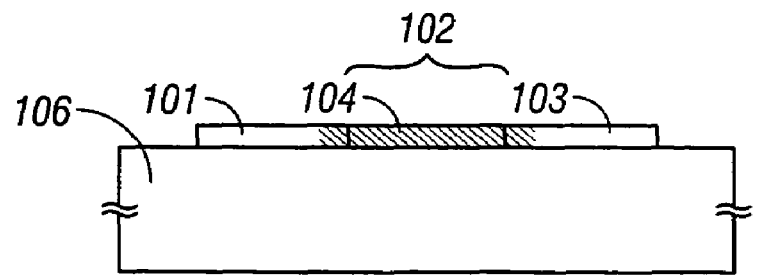
Figure 2A:
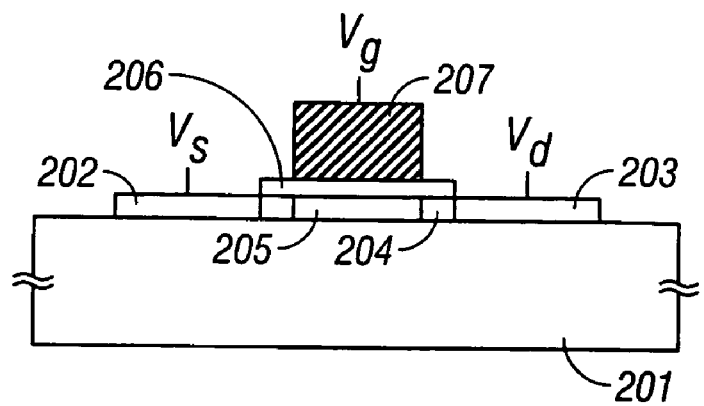
FIGS. 2A to 2C are diagrams for explanation of a short-channel effect.
Figure 2B:
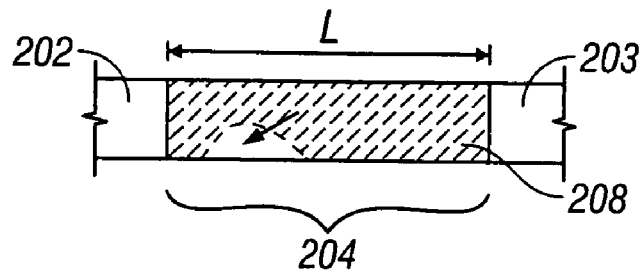
Figure 2C:
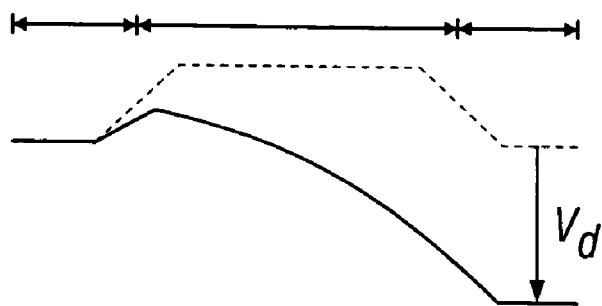

The structure of an active layer in a pinning TFT according to the present invention will be described with reference to FIGS. 1A to 1C. FIG. 1A is a top view, FIG. 1B is a cross-sectional view taken along a line A-A' of the top view; and FIG. 1C is a cross-sectional view taken is along a line B-B' of the top view.

In FIG. 1A, reference numeral 101 denotes a source region, 102 is an active region, and 103 is a drain region. These regions are called "active layer" in a lump. The active layer of this embodiment is formed of a polycrystalline silicon film (polysilicon film). All of known means may be used for the method of forming a polycrystalline silicon film.

Also, the thickness of the active layer is 10 Å to 75 nm (preferably 15 to 45 nm). If the thickness is 10 Å nm or less, a contact resistance of the source/drain contact becomes high which is not preferable. Also, if the thickness is thinner than 75 nm, an off-state current can be more reduced (a leak current when the TFT is off) as it is thinned.

Further, in FIG. 1A, a plurality of impurity regions 104 extending from the source region 101 to the drain region 103 are regions and the impurity regions 104 pin depletion layers (hereinafter referred to as "pinning region"). And, in the active region 102 regions between the respective impurity regions 104 are channel forming regions 105. That is, in the present invention, the basic structure of the active region 102 is made up of a plurality of pinning regions 104 and a plurality of channel forming regions 105.

The most typical structure is a structure in which, as shown in FIG. 1A, the pinning regions 104 and the channel forming regions 105 are substantially in parallel with each other and also alternately aligned. This structure can be regarded as the active region 102 being divided into a plurality of channel forming regions by the pinning regions 104.

Also, a path for allowing majority carriers to flow from the channel forming regions 105 toward the drain region 103 needs to remain on at least a part of the joint portion between the active region 102 and the drain region 103. In other words, the joint portion is designed such that the pinning regions are discontinuously disposed. This is closely related to the fact that the pinning TFT according to the present invention exhibits a high operation performance.

This pinning region 104 can be formed by adding impurity elements that permit the energy band of polycrystalline silicon to be shifted thereto. Accordingly, the energy band can be also called "a region shifting the energy band".

Figure 3A:
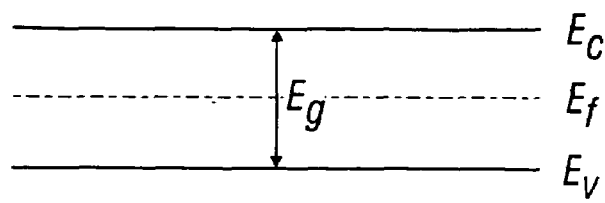
FIGS. 3A to 3C are diagrams showing an energy state of a channel forming region.
Figure 3B:
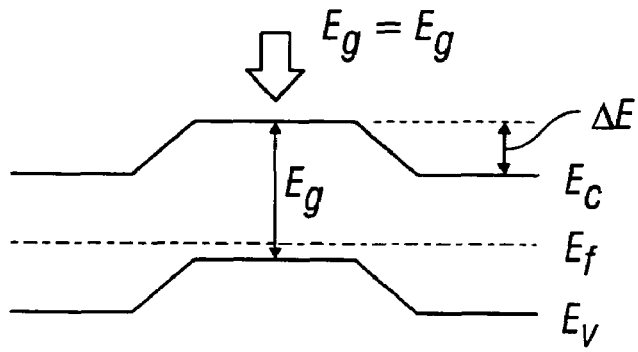

Impurity elements that allow the energy band to be shifted will be described with conceptual diagrams shown in FIGS. 3A to 3C. FIG. 3A shows an energy band state of an undoped polycrystalline silicon. In this example, the addition of the impurity elements (for example, boron, indium or the like) which allow the energy band to be shifted in a direction of impeding the movement of electrons makes the energy band change into an energy state shown in FIG. 3B.

In this situation, although no energy band gap changes in the impurity element addition region, Fermi level (Ef) moves to a valence band (Ev) side. As a result, the energy state is apparently shifted to the upper side. For that reason, an energy barrier higher (for electrons) by ΔE than that of an undoped region is formed in the impurity element addition region.

Figure 3C:
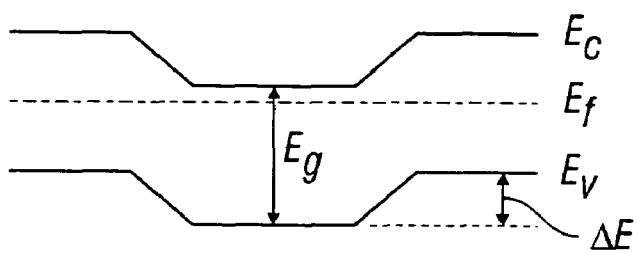

Also, when the impurity elements (for example, phosphorus, arsenic, antimony, etc.) that allow the energy band to be shifted in a direction of impeding the movement of holes are added in the state shown in FIG. 3A, the energy state is changed as shown in FIG. 3C.

In this case, the Fermi level in the impurity element addition region moves to the conductive band (Ec) side so that the energy state is apparently shifted to the lower side. For that reason, an energy barrier higher (for holes) by ΔE than that of an undoped region is formed in the impurity element addition region.

As described above, there occurs a difference in energy corresponding to ΔE between the (undoped) region to which no impurities are added and the pinning region. The height of the energy (potential) barrier is changed by the concentration of the added impurity elements.

In this way, according to the present invention, the impurity elements that allow the energy band to be shifted to the undoped semiconductor thin film, to thereby form a pinning region. The impurity elements of this type may be impurity elements having a conductive type reverse to that of the source/drain regions.

For example, in the case of manufacturing an N-channel type pinning TFT, elements selected from the Group XIII, representatively at least one kind of B (boron) and In (indium) may be used in the pinning region. Also, in the case of manufacturing a P-channel type pinning TFT, elements selected from the Group XV, representatively at least one kind of P (phosphorus), As (arsenic) and Sb (antimony) may be used in the pinning region.

The concentration of the impurities which are added to the pinning region 104 is adjusted basically such that the potential barrier in the pinning region 104 becomes sufficiently higher than that in the channel forming region 105. Typically, it may be adjusted in the range of $1\times10^{17}$ to $1\times10^{20}$ atoms/cm$^3$ (preferably $1\times10^{18}$ to $1\times10^{19}$ atoms/cm$^3$).

Also, it is preferable to form the pinning region 104 as large as possible at the side end portion of the active region 102 (an end portion which is out of contact with source/drain region and extends along a direction of length of the semiconductor pattern). It is effective to implant impurity elements for pinning in the side end portion because a leak current that is transmitted to the side end portion can be reduced.

Also, the pinning region 104 is formed so as to extend over at least the joint portion between the active region 102 and the drain region 103. This is because the drain side depletion layer spreads from a start point of the drain side joint portion. It is needless to say that the most desirable structure is that the pinning region is formed so as to extend from the source region 101 to the drain region 103 as shown in FIG. 1A.

Figure 4:
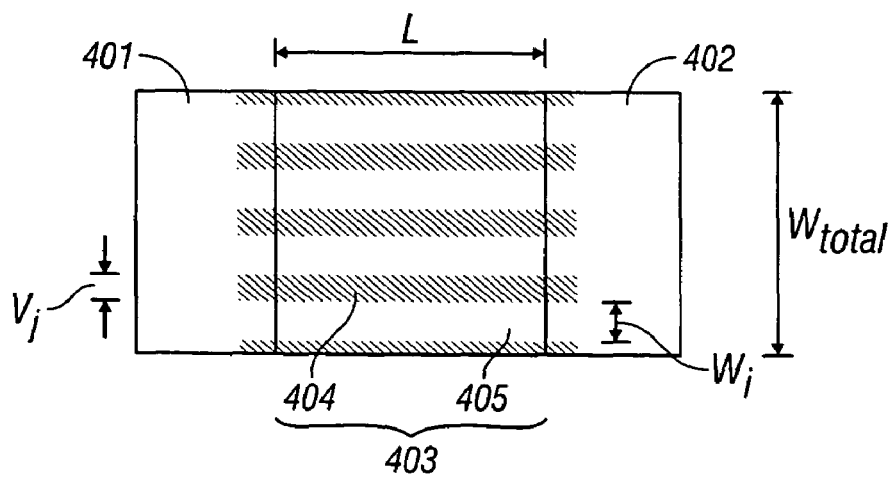
FIG. 4 is a diagram for explanation of a definition of an active region periphery.

The definition of the channel length and the channel width is made using FIG. 4. In FIG. 4, a distance between the source region 401 and the drain region 402 (corresponding to the length of the active region 403) is defined as the channel length (L). The present invention is effective in the case where the channel length is 2 μm or less, typically 30 to 500 nm (more preferably 50 to 200 nm). Also, a direction along the channel length is called "channel length direction".

Also, it is assumed that a width of an arbitrary pinning region 404 is a pinning width ($v_j$). The pinning width is set to 2 μm or less, preferably 50 to 300 nm (more preferably 1 to 50 nm). Then, assuming that a total of the widths of all the pinning regions existing in the active region 403 is an effective pinning width (V), it is defined by the following expression.

$$V = \sum_{j=1}^{n} v_j \quad (1)$$

In order to obtain the pinning effect, it is necessary to dispose at least one pinning region in the active region 403. That is, the condition of j=1 or more is required. Also, in the case of disposing the pinning region on the side end portion of the active region 403, the condition of j=2 or more is required.

Also, a width of the channel forming region 405 is set to a channel width ($w_i$). The channel width is set to 1 μm or less, preferably 50 to 300 nm (more preferably 3 to 50 nm). When the channel width is ten times or more as large as the thickness of the active region, the pinning effect is reduced, which is not preferable. Also, when the channel width is 3 nm or less, there is a risk that the quantum effect is exhibited, which is not much preferable.

Also, assuming that a total of the above channel widths ($w_i$) is an effective channel width (W), it is defined by the following expression.

$$W = \sum_{i=1}^{m} w_i \quad (2)$$

In the case where the pinning region is disposed only on the side end portion of the active region 403, i=1 is satisfied. Also, in order to effectively obtain the pinning effect, it is preferable to dispose the pinning region on a portion other than the side end portion of the active region 403. In this case, i=2 or more.

Also, assuming a total of the total of pinning regions (effective pinning width) and the total of the channel forming regions (effective channel width) as described above is a total channel width ($W_{total}$), it is defined by the following expression.

$$W_{total} = V + W \quad (3)$$

The total channel width ($W_{total}$) corresponds to the width of the active region 403 (a length perpendicular to the channel length direction of the active region). Also, a direction along the total channel width is called "channel width direction".

Since the semiconductor device of the present invention as defined in the above manner is particularly applied to a semiconductor device extremely small in channel length, the pinning region and the channel forming region must be formed at extremely fine dimensions.

For that reason, the extremely fine photolithography technology is required for the formation of the pinning region 104 in FIG. 1A. That is, the above fine pinning region and channel forming region cannot be formed without using the fine exposing technique employing an eximer laser, an electronic beam, a focusing ion beam or the like.

Also, it is needless to say that it is preferable to use a technique that enables the fine concentration control such as the ion implantation technique (quantum separated ion addition) in order to finely control the amount of introducing the impurity elements. It is needless to say that the ion doping method (plasma doping method, etc.) which does not separate quantum can be used.

It is preferable that the impurity elements which are added to the pinning region 104 are activated by furnace annealing, laser annealing, lamp annealing or the like. This activating process may be conducted together with the annealing process in a post-process such as the formation of the gate insulating film, or may be conducted separately from the annealing process.

Then, a cross-sectional view taken along a line A-A' of a top view shown in FIG. 1A is shown in FIG. 1B. In FIG. 1B, the parts described with reference to FIG. 1A will be described referring to the same reference.

In FIG. 1B, reference numeral 106 denotes a substrate having an insulating surface. The substrate having an insulating surface to be used may be a glass substrate having a underlayer film, a silica substrate (regardless of the presence/absence of the underlayer film), a silicon substrate having a thermal oxide film, a ceramic substrate having a underlayer film or the like.

It is desirable that the depth (a depth direction length) of the pinning region 104 is set to at least the thickness of the active region 102. In the case of using a substrate having a underlayer film as the substrate 106 having an insulating surface, it is effective to form the pinning region 104 such that it enters the inside of the underlayer film.

Then, a cross-sectional view taken along a line B-B' of FIG. 1A is shown in FIG. 1C. In the cross-sectional view taken along the line B-B', the pinning region 104 appears as shown in FIG. 1C. If the pinning region 104 is formed so as to enter the inside of the drain region 103 as shown in FIG. 1C, the pinning effect on the drain side depletion layer is enhanced so as to be effectively. Also, the configuration of the pinning region 104 is not limited to this embodiment.

The pinning TFT according to the present invention is directed to a semiconductor device having the active region thus structured. Subsequently, the actions of the pinning region 104 and the channel forming region 105 and the effects obtained by the actions will be described.

First, a first effect will be described. The most significant object of the present invention is to suppress (pin) the depletion layer spreading from the drain side to the source side, to thereby prevent the deterioration of a potential barrier on the source side due to the drain voltage. Then, the suppression of the spread of the depletion layer can sufficiently prevent the lowering of a threshold value voltage and the deterioration of the withstand voltage due to punch-through.

In FIGS. 1A to 1C, the pinning region 104 locally (for example, linear or dot-shaped) formed in the active region 102 acts as a stopper for the depletion layer spreading from the drain side to effectively suppress the spread of the depletion layer. The spread of the depletion layer in a depth direction is limited by the thickness of the active region.

Accordingly, the spread of the depletion layer prevents the diffusion potential on the source side from being lowered, to thereby prevent the punch-through phenomenon. Also, since an increase in the depletion layer charges due to the spread of the depletion layer is suppressed, the lowering of the threshold value voltage is also prevented.

As described above, the formation of the pinning region 104 makes it possible to suppress or prevent the short-channel effect which causes a very serious problem when fining. This effect is the most significant effect of the semiconductor device according to the present invention.

Then, a second effect will be described. In the present invention, the narrow channel effect can be intentionally enhanced by the pinning region. The narrow channel effect is a phenomenon which is observed when the channel width is remarkably narrow, bringing the threshold value voltage to an increase (as to the detail, refer to "Submicron Device I" which is referred to in the conventional example).

Figure 5:
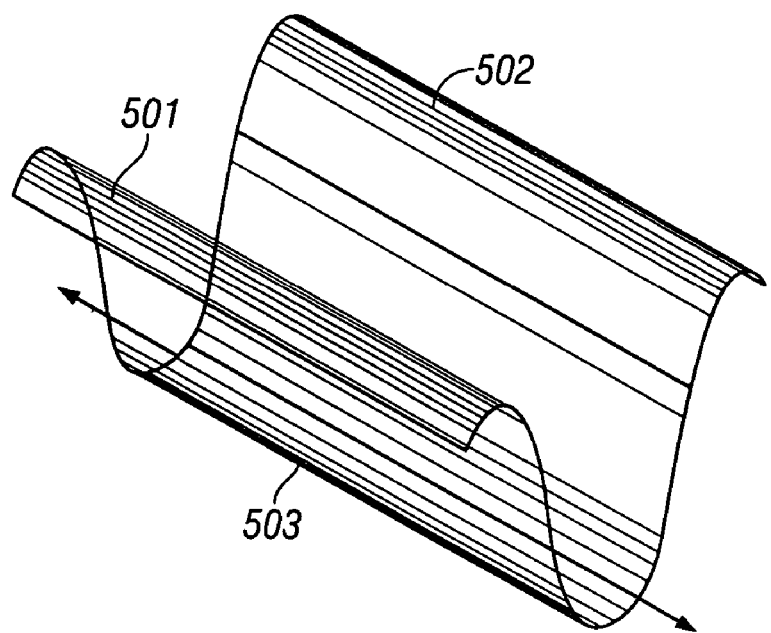
FIG. 5 is a diagram showing an energy state of a channel forming region.

FIG. 5 is a diagram showing an energy state (potential state) of the active region 102 when the pinning TFT according to this embodiment is operative. In FIG. 5, regions 501 and 502 correspond to the energy states of the pinning region 104, and a region 503 corresponds to the energy state of the channel forming region 105.

As is apparent from FIG. 5, the pinning region 104 forms a barrier high in energy, and the channel forming region 105 forms a region low in energy. For that reason, the carriers preferentially move in the channel forming region 105 low in energy state.

In this way, the barrier high in energy is formed by the pinning region 104 so that the threshold value voltage of that portion increases. As a result, the threshold value voltage observed as a whole is also increased. The narrow channel effect is more remarkably exhibited as the effective channel width is narrowed.

As described above, in the present invention, the concentration of impurities which are added to the pinning region 104 and the effective channel width are freely designed, thereby being capable of controlling the degree of the narrow channel effect and adjusting the threshold value voltage. In other words, the control of the pinning effect makes it possible to balance a drop of the threshold value voltage due to the short channel effect with an increase in the threshold value voltage due to the narrow channel effect to adjust the threshold value voltage to a desired value.

Also, since the elements of the Group XIII are added to the pinning region in case of the N-channel type, and the elements of the Group XV are added thereto in case of the P-channel type, the threshold value voltage is shifted so as to increase (positive in case of the N-channel type, and negative in case of the P-channel type) on a portion where the elements are added. In other words, since the threshold value voltage is locally increased, the whole threshold value voltage is also increased as much. Therefore, in order to adjust the threshold value voltage to a desired value, it is important that the concentration of impurities which are added to the pinning region is set to an appropriate value.

Subsequently, a third effect will be described. The pinning TFT described in this embodiment is advantageous in that the channel forming region 105 is formed by an intrinsic or substantially intrinsic region, and majority carriers move in that region.

In the present specification, the intrinsic region means a region where impurity elements that give n-type or p-type or impurity elements such as carbon, nitrogen or oxygen are not intentionally added. Also, the substantially intrinsic region is directed to a region lower in impurity concentration than the spin density, a region substantially ½ in the activation energy, or a region having an one-conductive type in a range where the threshold value voltage can be controlled.

In the case a region where the carriers move is intrinsic or substantially intrinsic, the deterioration of the mobility due to the scattering of the impurities becomes remarkably small to obtain a high mobility. This matter is a large difference between the present invention and the channel doping method.

The scattering of carriers is roughly classified into lattice scattering and impurity scattering, and the total mobility is decided by those influences. For example, the mobility ($\mu_{lattice}$) when the mobility is affected by the lattice scattering is proportional to $-3/2$ power of a temperature (T) and proportional to $-5/2$ power of the effective mass (m*) of the carriers. This relation is represented by the following expression (4).

$$\mu \text{ lattice} \propto (m^*)^{-5/2} T^{-3/2} \quad (4)$$

The mobility ($\mu_{lattice}$) when the mobility is affected by the impurity scattering is proportional to $3/2$ power of the temperature (T) and proportional to $-½$ power of the effective mass (m*) of the carriers. Further, the mobility is proportional to the concentration (N) of the ionized impurities. This relation is represented by the following expression (5), $$\mu \text{ impurity} \propto (m^*)^{-1/2} N^{-1} T^{3/2} \quad (5)$$

Then, the whole mobility ($\mu_{total}$) which are observed by an influence of those mobilities on each other is represented by the following expression.

$$\mu total = (1/\mu lattice + 1/\mu impurity)^{-1} \quad (6)$$

In other words, that the channel forming region is intrinsic or substantially intrinsic means that the impurity concentration N in Expression (5) infinitely approaches 0, and $\mu_{impurity}$ approaches infinity.

As a result, since the term of $1/\mu_{impurity}$ becomes small to the degree that the term can be ignored in Expression (6), the whole mobility ($\mu_{total}$) approaches the mobility ($\mu_{lattice}$) when the mobility is affected by the lattice scattering. In other words, it can be regarded as the mobility taking only the lattice scattering into consideration.

Also, in the case where a linear pinning region is extended from the source region to the drain region as shown in FIG. 1A, there is obtained such an effect that the movement path of majority carriers is regulated by the pinning region.

As described above, the energy state of the channel forming regions sandwiched between the respective pinning regions becomes a state shown in FIG. 5. In the structure shown in FIG. 1A, it is presumed that a plurality of slits having the energy state shown in FIG. 5 are arranged.

Figure 6:
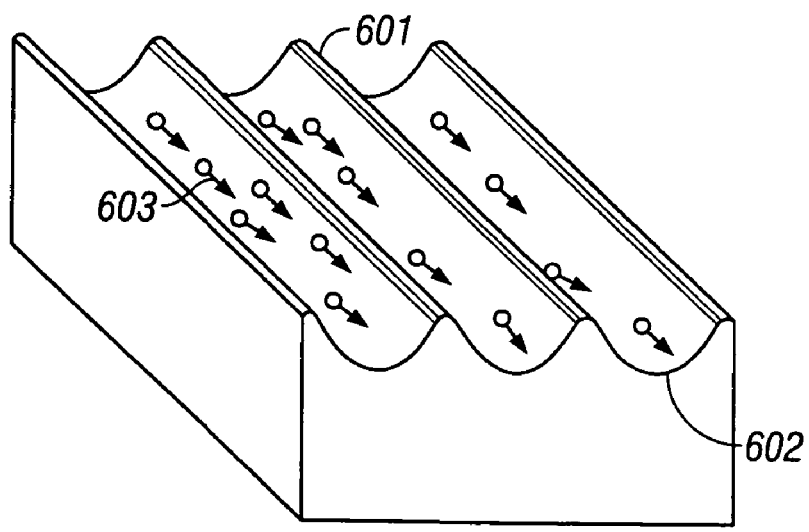
FIG. 6 is a schematic diagram showing carrier movement paths.

FIG. 6 schematically shows this appearance. In FIG. 6, reference numeral 601 denotes a pinning region, and 602 is a channel forming region. Also, reference numeral 603 denotes majority carriers (electrons or holes). As shown in FIG. 6, the carriers 603 preferentially move in the respective channel forming regions 602 since they cannot exceed the respective pinning regions 601. In other words, the movement path of the majority carriers is regulated by the pinning regions.

With the regulation of the movement path of the majority carriers, the scattering due to self-collision between the carriers is reduced. This greatly contributes to an improvement of the mobility. Also, since the pinning regions 104 are discontinuously disposed on the joint portions between the active region and the drain region, the majority carriers flow into the drain region 103 between the pinning regions.

Furthermore, because only extremely slight impurity elements exist in the intrinsic or substantially intrinsic channel forming region, there occurs the speed overshoot effect (refer to K. Ohuchi et al., Jpn. J. Appl. Phys. 35, pp. 960, 1996) that the mobility of electrons becomes higher in speed than the normal one even at a room temperature, as a result of which the mobility becomes remarkably large.

The above effects make it possible that the pinning TFT according to the present invention realizes a high reliability and a high mobility together.

The present invention is directed to engineering conducted on the active region of the insulating gate transistor, and is not basically a technique limited to the transistor structure. Therefore, the present invention is applicable to the insulating gate transistors of any structures and compositions.

Embodiment 2

In this embodiment, a process of manufacturing the pinning TFT having the construction described in Embodiment 1 will be described. The description will be given with reference to FIGS. 7A to 7D.

Figure 7A:
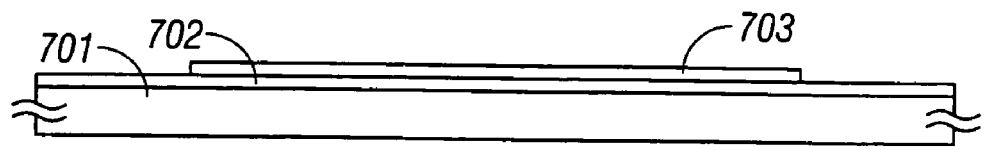
FIGS. 7A to 7D are diagrams showing a process of manufacturing a semiconductor device.

First, a glass substrate 701 is prepared, and a underlayer film 702 formed of a silicon oxide film is formed on the glass substrate 701. Then, a polycrystalline silicon film (not shown) is formed on the underlayer film 702 to form an active layer 703 by patterning. The polycrystalline silicon film 703 may be directly formed through the CVD method, or may be formed by crystallizing an amorphous silicon film (FIG. 7A).

Also, the crystallization of the amorphous silicon film may be made by any means of furnace annealing, laser annealing and lamp annealing. Further, catalytic elements that promote the crystallization of silicon may be used.

In this embodiment, there is employed the technique described in the first embodiment of Japanese Patent Laid-open Publication No. Hei 7-130652 by the present inventors. This publication discloses a technique in which an extremely thin layer containing catalytic elements therein is formed on the entire surface of an amorphous silicon film through the spin coating method to crystallize the amorphous silicon film using the catalytic action.

The catalytic elements to be used may be one or plural kinds of elements selected from nickel (Ni), cobalt (Co), iron (Fe), palladium (Pd), platinum (Pt), copper (Cu), gold (Au), germanium (Ge), lead (Pb) and indium (In).

Figure 7B:
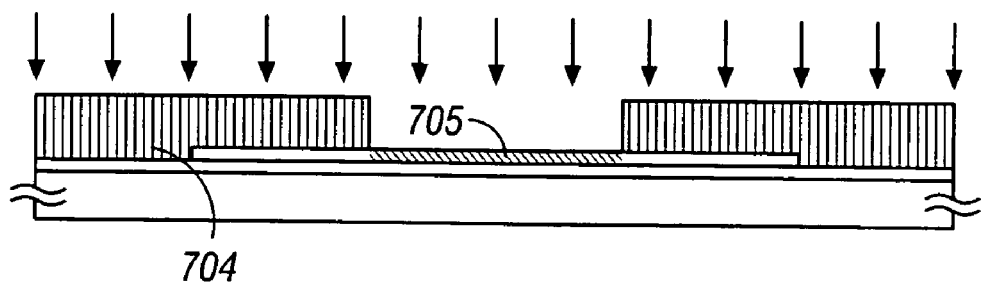

Then, a resist mask 704 is disposed on the active layer 703, and impurity elements that permit an energy band to be shifted are locally added to the active layer 703. A pinning region 705 is formed during a process of adding the impurity elements. The impurity elements to be added may be those employed in Embodiment 1 (FIG. 7B).

The resist mask 704 is exposed by the photolithography technology using excimer laser, an electronic beam, a focusing ion beam or the like to form extremely fine openings. Then, in this state, the impurity elements (the elements belonging to the Group XIII or XV) are added to the surface through the ion implanting method to form the pinning region 705.

Through the above process, the pinning regions 705 are formed on the active layer 703 in an arrangement described in Embodiment 1 referring to FIG. 1A. Also, the concentration of added impurity elements may be adjusted so as to satisfy the conditions described in Embodiment 1.

In this way, upon the completion of the process of adding the impurity elements, after the resist mask 704 has been removed, a heat treatment is conducted at 450 to 650° C. (preferably 550 to 600° C.), to thereby activate the impurity elements added to the pinning region 705. The pinning effect can be obtained even if the activation is not conducted, but it is more effective to conduct the activation in stabilizing the electric characteristic of the TFT.

After the formation of the pinning region 705, a gate insulation film 706 is formed on the active layer 703. The gate insulating film 706 may be formed of a silicon oxide film, a silicon nitride film or a laminated film consisting of those films.

In this embodiment, the gate insulating film 706 is formed after the formation of the pinning region 705. However, the pinning region may be formed by through-doping after the formation of the gate insulating film.

Figure 7C:
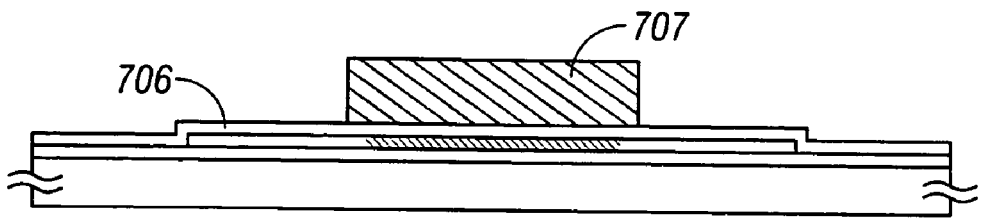

Subsequently, a metal thin film (not shown) made of aluminum or mainly containing aluminum is formed on the surface and then patterned to form a metal pattern 707 which will become the original of a gate electrode later. In this embodiment, an aluminum film containing scandium of 2 wt % therein is used. Instead, a tantalum film, a laminated film consisting of an aluminum film and a titanium film, etc., may be used. (FIG. 7C).

In this process, the technique disclosed in Japanese Patent Laid-open Publication No. Hei 7-135318 by the present inventors is utilized. This publication discloses the technique in which a source/drain region and a low-concentration impurity region are formed in a self-aligning manner using an oxide film formed by anodic oxidation.

First, an anodic oxidizing process is conducted in a 3% oxalic acid aqueous solution while the resist mask (not shown) used for patterning of the aluminum film remains, to thereby form a porous anodic oxide film 708. In this situation, since the resist mask remains on the upper surface, the porous anodic oxide film 708 is formed on only a side surface of the original 707 of the gate electrode. In the technique disclosed in Japanese Patent Laid-open Publication No. Hei 7-135318, the thickness of the porous anodic oxide film 708 will become a length of the low-concentration impurity region (also called "LDD region") later.

Then, after the removal of the resist mask not shown, an anodic oxidation process is conducted in an electrolyte in which an ethylene glycol solution is mixed with tartaric acid of 3%. In this process, a fine non-porous anodic oxide film 709 is formed. Since the electrolyte also permeates the inside of the porous anodic oxide film, the minute and non-porous anodic oxide film 709 is also formed inside thereof.

Figure 7D:
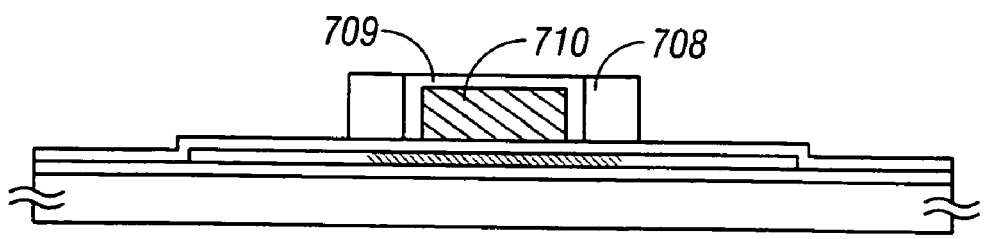

An aluminum film 710 remaining after the above-described two anodic oxidizing processes substantially functions as the gate electrode (FIG. 7D).

Figure 8A:
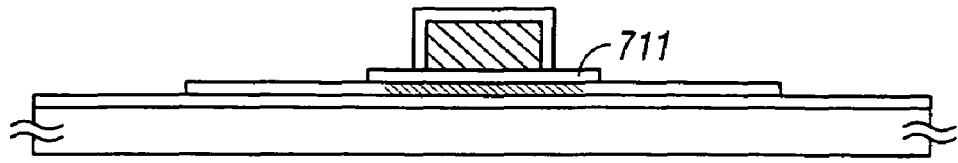
FIGS. 8A to 8D are diagrams showing a process of manufacturing a semiconductor device.

Thereafter, the gate insulating film 706 is etched through the dry etching method with the gate electrode 710 and the porous anodic oxide film 708 as masks. Then, the porous anodic oxide film 708 is removed. An end portion of the gate insulating film 711 thus formed comes to a state in which it is exposed as large as the thickness of the porous anodic oxide film 708 (FIG. 8A).

Then, a process of adding impurity elements that give one conductivity is conducted. The impurity elements to be used may be phosphorus or arsenic if they are of the n-type, and boron or indium if they are of the p-type. This embodiment shows an example in which an N-channel pinning TFT is manufactured with the addition of phosphorus. It is needless to say that the impurity elements which are added to the above-described pinning region 705 have the conductive type reverse to that of the impurity elements to be added in this process.

Figure 8B:
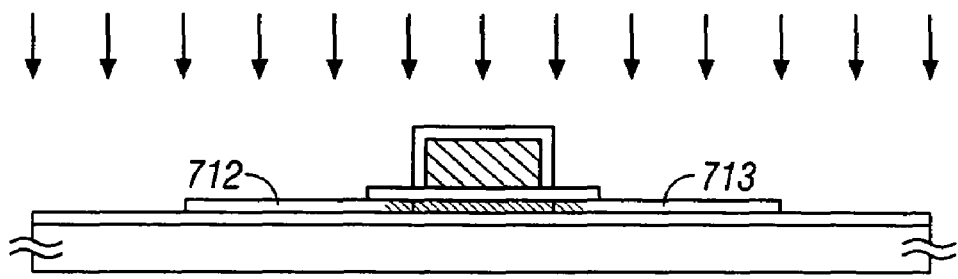

In this embodiment, the first impurity addition is conducted at a high-acceleration voltage to form n− regions 712 and 713. In this situation, since the acceleration voltage is high to the degree of 80 keV, the impurity elements are added to not only the surface of the active layer but also a portion under the end portion of the exposed gate insulating film (FIG. 8B).

Figure 8C:
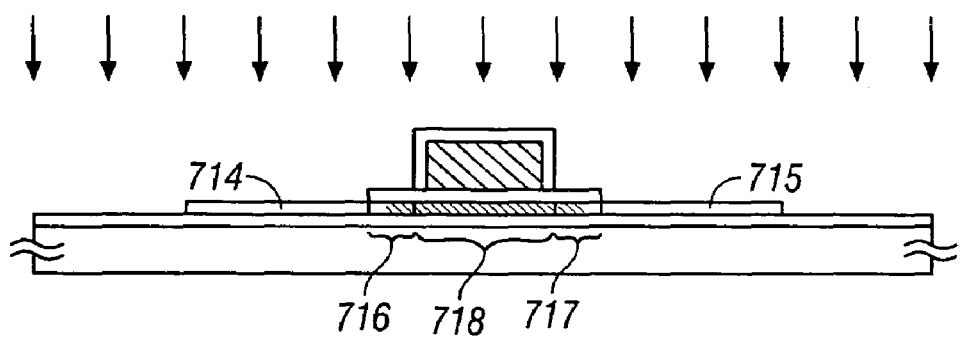

Further, the second impurity addition is conducted at a low-acceleration voltage to form n+ regions 714 and 715. In this situation, since the acceleration voltage is low to the degree of 10 keV, the gate insulating film functions as a mask. Also, the n+ regions 714 and 715 are adjusted so that the sheet resistance becomes 500 Ω or less (preferably 300 Ω or less) (FIG. 8C).

The impurity regions formed in the above process has the source region 714 and the drain region 715 as the n+ region and the low-concentration impurity regions 716 and 717 as the n− region.

Also, in this step, no impurity elements are added to the active region 718 directly under the gate electrode. For that reason, the active region 718 is made up of the pinning region 705 and the intrinsic or substantially intrinsic channel forming region (not shown) as described FIGS. 1A to 1C.

The low-concentration impurity regions 716 and 717 have the effect of relieving a high electric field applied between the channel forming region and the drain region 715, and are also called "LDD (light doped drain) regions". The LDD regions are also regarded as a part of the impurity regions.

Also, in this embodiment, the end portion of the pinning region 705 is formed so as to reach to the inside of the low-concentrate ion impurity regions 716 and 717. However, it may be structured so as not to reach to the inside thereof, or may be structured so as to go through the inside of the source/drain region.

In the above way, after the process of adding the impurity elements has been completed, the impurity elements are activated by the combination of furnace annealing, laser annealing, lamp annealing, etc. At the same time, a damage of the active layer which is caused during the adding process is also repaired.

Then, an interlayer insulating film 719 is formed in thickness of 500 nm. As the interlayer insulating film 719, there may be used a silicon oxide film, a silicon nitride film, a silicon oxidized nitride film, an organic resin film or a laminated film of those films. As the organic resin film, there are used polyimide, acrylic, polyamide, polyimide amide or the like. The advantages of the organic resin film are, for example, stated below:

(1) The film forming method is simple.
(2) The thickness of the film can be thickened with ease.
(3) The parasitic capacitance can be reduced since the relative dielectric constant is low.
(4) The flatness is excellent.

Figure 8D:
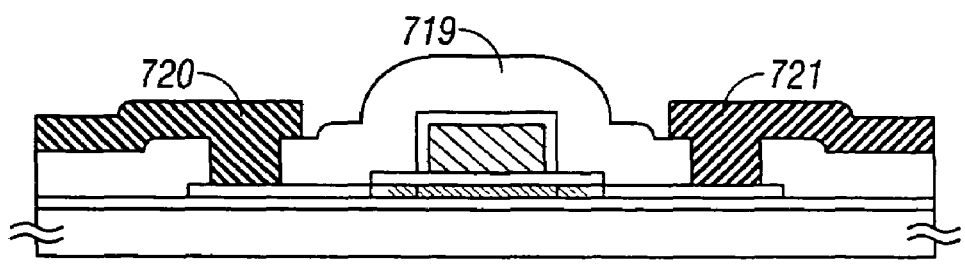

Subsequently, after contact holes are formed, a source electrode 720 and a drain electrode 721 are formed. Finally, the entire substrate is heated in a hydrogen atmosphere at 350° C. for one to two hours to hydride the entire device, thereby terminating the dangling bond in the film (in particular, in the active layer). The above processes make it possible to manufacture a TFT structured as shown in FIG. 8D.

In this embodiment, the pinning regions are formed before the source/drain regions are formed. Alternatively, the pinning regions may be formed after the source/drain regions are formed. In this case, self-aligning structure is not formed unlike in this embodiment, and the source/drain region must be formed by patterning.

Figure 9A:
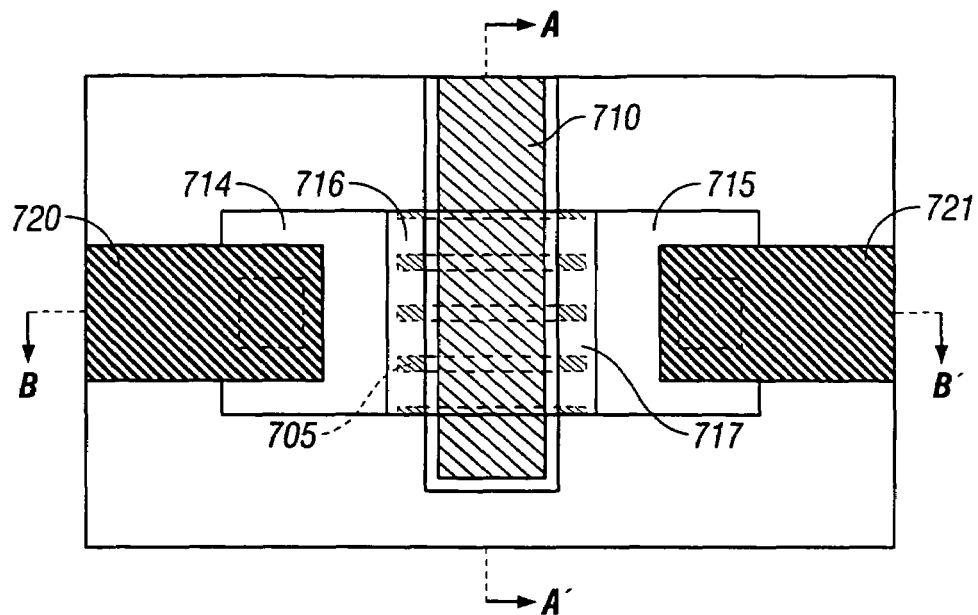
FIGS. 9A to 9C are diagrams showing the entire structure of a semiconductor device.
Figure 9B:
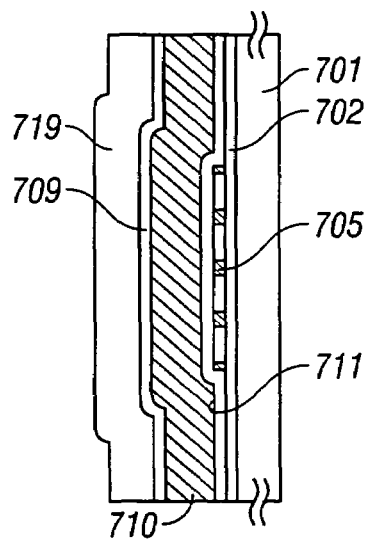
Figure 9C:
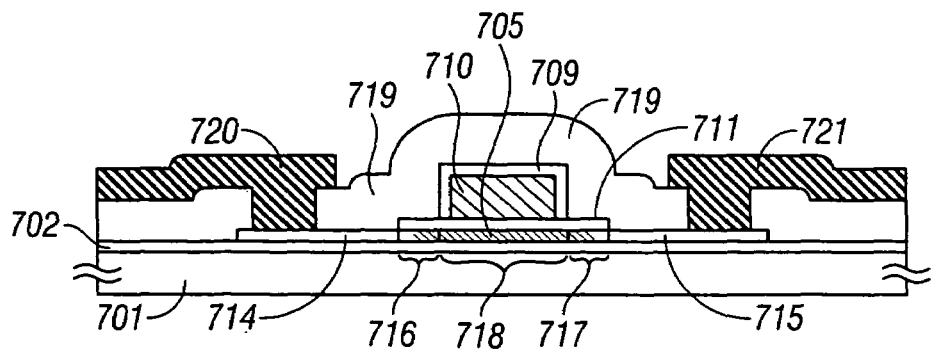

The entire structure of the pinning TFT manufactured by the processes according to this embodiment is shown in FIGS. 9A to 9D. FIG. 9A is a top view of the pinning TFT, FIG. 9B is a cross-sectional view of the pinning TFT along a channel width direction (a cross-section cut along the line A-A'), and FIG. 9C is a cross-sectional view of the pinning TFT along a channel length direction (a cross-section cut along the line B-B').

In FIGS. 9A, 9B and 9C, reference marks used in this embodiment (FIGS. 7A to 7D and 8A to 8D) are used as they are. The respective reference marks indicated in FIGS. 9A, 9B and 9C will be omitted because they have been already sufficiently described.

Embodiment 3

In this embodiment, a process of manufacturing a TFT constituted differently from Embodiment 2 will be described. The description will be given with reference to FIGS. 10A to 10E. However, since the manufacturing process is basically identical with that described in Embodiment 2, only differences therebetween will be described in detail.

First, a silicon substrate 11 having a thermal oxide film 12 on a surface thereof is prepared as a substrate having an insulating surface. This substrate 11 is obtained by thermally oxidizing a silicon substrate deoxidized using hydrogen in an atmosphere containing HCl (hydrogen chloride). Instead of the silicon substrate thus structured, a quartz substrate or a ceramic substrate having an underlayer film on a surface thereof may be used. Since the quartz substrate is expensive, it is better to devise such that an inexpensive quartz substrate is polished by CMP or the like for use.

Subsequently, a crystalline semiconductor thin film is formed on the thermal oxide film 12. In this embodiment, as the crystallizing means, there is used a technique disclosed in a second embodiment of Japanese Patent Laid-open Publication No. Hei 7-130652 (as to the details, refer to Japanese Patent Laid-open Publication No. Hei 8-78329). It is needless to say that the technique of the second embodiment of the latter may be used.

In the technique disclosed in Japanese Patent Laid-open Publication No. Hei 8-78329, there is formed a mask insulating film 14 which selects a region to which catalytic elements are added after an amorphous semiconductor thin film (an amorphous silicon film is exemplified in this embodiment) 13 is formed. The mask insulating film 14 has openings at a plurality of portions for adding catalytic elements. The position of a crystal region can be decided by the positions of the openings.

Figure 10A:
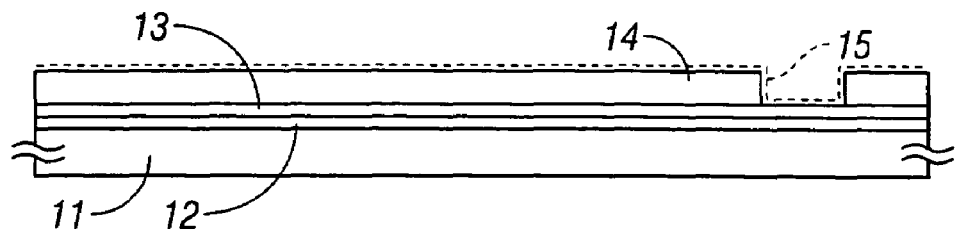
FIGS. 10A to 10E are diagrams showing a process of manufacturing a semiconductor device.

Then, a solution containing catalytic elements that promote the crystallization of the amorphous silicon film (nickel is exemplified in this embodiment) is coated on the film through the spin coating method to form an Ni contained layer 15 (FIG. 10A).

Subsequently, upon the completion of the process of adding the catalytic elements, after hydrogen is extracted from the film at 450° C. for about one hour, a heat treatment is conducted in an inactive atmosphere, a hydrogen atmosphere or an oxygen atmosphere at a temperature of 500 to 700° C. (representatively 550 to 650° C.) for 4 to 24 hours to crystalize the amorphous silicon film 13. In this embodiment, a heat treatment is conducted in a nitrogen atmosphere at 570° C. for 14 hours.

Figure 10B:
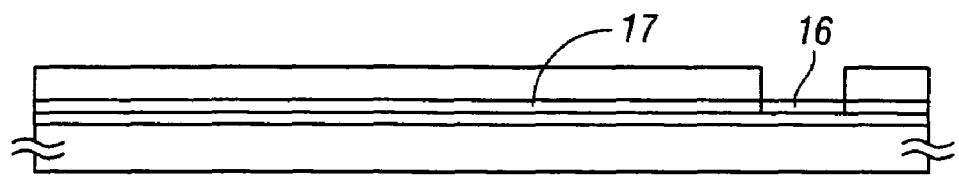

In this state, the crystallization of the amorphous silicon film 13 progresses preferentially from a nucleus produced in the region 16 to which nickel is added to form a crystal region 17 that grows substantially in parallel with the substrate surface of the substrate 11. The present inventors call this crystal region 17 "lateral growth region". Because the individual crystals are gathered in a state where they are relatively uniformly disposed in the lateral growth region, there is advantageous in that it is excellent in crystallinity as a whole (FIG. 10B).

After the heat treatment for crystallization has been completed, the mask insulating film 14 is removed to conduct a process of gettering the catalytic elements. This process is a technique in which a heat treatment is conducted in an atmosphere containing halogen elements therein, and the catalytic elements used for crystallization are removed by use of the gettering effect of the halogen elements on metal elements.

In order to satisfactorily obtain the gettering effect of the halogen elements, it is preferable to conduct the above heat treatment at a temperature exceeding 700° C. When the temperature is 700° C. or lower, the decomposition of halogen compound in the processing atmosphere becomes difficult, with the result that there is a risk that the gettering effect cannot be obtained. For that reason, in this embodiment, the heat treatment is conducted at a temperature exceeding 700° C., preferably 800 to 1000° C. (representatively 950° C.), and a processing period is set to 0.1 to 6 hours, representatively 0.5 to 1 hour.

This embodiment shows an example in which a heat treatment is conducted at 950° C. for 30 minutes in an atmosphere containing hydrogen chloride (HCl) with the concentration of 0.5 to 10 vol % (3 vol % in this embodiment) with respect to the oxygen atmosphere. If the concentration of HCl is set to more than the above concentration, since unevenness occurs on the surface of the silicon film to the degree of the thickness of the film, such a concentration is not preferable.

Also, an example using HCl gas as a compound containing halogen elements is shown, but as other gases, there can be used one kind or plural kinds of compounds selected from compounds including halogen such as HF, $NF_3$, HBr, $Cl_2$, $ClF_3$, $BCl_3$, $F_2$, $Br_2$ or the like, representatively.

Figure 10C:
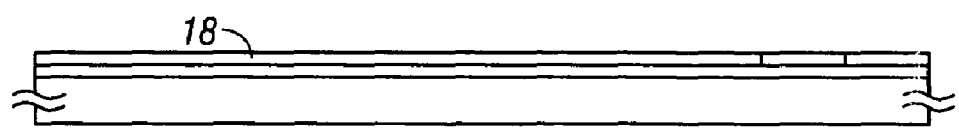

In this process, it is presumed that nickel in the silicon film is gettered by the action of chlorine into volatile nickel chloride, and nickel chloride is removably eliminated to the processing atmosphere. Then, after this process has been conducted, the concentration of nickel in the lateral growth region 18 is reduced down to $5 \times 10^{17}$ atoms/cm$^3$ or less (FIG. 10C).

The value of $5 \times 10^{17}$ atoms/cm$^3$ is a lower limit of detection of SIMS (Secondary Ion Mass Spectroscopy). As a result of analyzing the TFT sampled by the present inventors, there has not been confirmed an influence of nickel on the TFT characteristic when the concentration is $1 \times 10^{18}$ atoms/cm$^3$ or less (preferably $5 \times 10^{17}$ atoms/cm$^3$ or less).

In the above way, after catalytic elements (nickel) has been removed, an active layer 19 formed of only the lateral growth region 18 is formed by patterning. At the formation, it is preferable that a direction along which individual crystal grains that constitute the lateral growth region 18 extend is made coincided with a channel length direction.

Figure 10D:
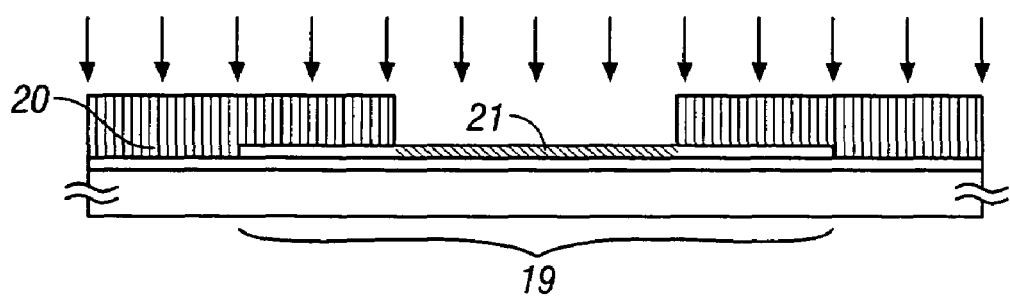
Figure 10E:
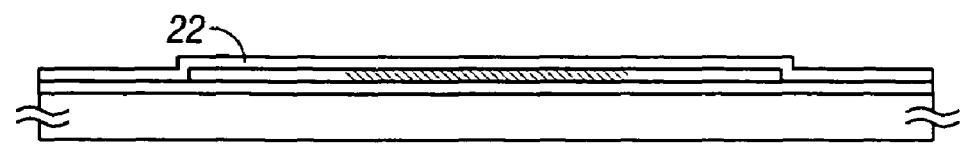

Then, a resist mask 20 is disposed as in Embodiment 1, and impurity elements are added thereto to form a pinning region 21 (FIG. 10D).

Subsequently, a gate insulating film 22 formed of an insulating film containing silicon therein is formed. The thickness of the gate insulating film 22 may be adjusted within a range of 20 to 250 nm taking an increase of the thickness by the later thermal oxidizing process into consideration. Also, as the film forming method, there may be used a known gas-phase method (plasma CVD method, sputtering method or the like).

Then, after the gate insulating film 22 has been formed, a heat treatment for thermal oxidation is conducted. This heat treatment may be conducted in an oxygen atmosphere or in an oxidation atmosphere containing halogen elements. More gettering effect can be expected by the inclusion of halogen elements.

Through the above heat treatment, a thermal oxidation reaction progresses on a boundary between the active layer 19 and the gate insulating film 22, and the thickness of the gate insulating film 22 increases as much as the thermal oxide film. After the thermal oxide film is thus formed, there can be obtained a semiconductor/insulating film boundary very small in boundary level. Also, there is an effect of preventing the failure of formation of the thermal oxide film on the active layer end portion (edge sinning).

Thereafter, the same process as that in Embodiment 1 is conducted to form a gate electrode and so on, thereby completing a pinning TFT structured as shown in FIG. 9. The TFT thus manufactured realizes the same pinning effect as described in Embodiment 1.

In this embodiment, the pinning region is formed after the gettering process has been conducted. However, the gettering process may be conducted after the pinning region has been formed. In this case, there is advantageous in that the activation of the pinning region is conducted together with the gettering process. However, attention must be paid so that the thermal diffusion of the impurity elements added to the pinning region should be suppressed.

Also, the crystalline silicon film manufactured by the manufacturing process according to this embodiment has a unique crystal structure. The present inventors analyzes the crystalline silicon film using various analyzing techniques such as electron beam diffraction, X-ray diffraction, HRTEM (high-resolution transmission type electron microscopy), SIMS (Secondary Ion Mass Spectroscopy) or the like (its detail is described in Japanese Patent Application No. Hei 9-165216).

It is proved from the above experimental result, the crystalline silicon film according to this embodiment has a main orientation face of {110} face. Also, as a result of observing the lattice stripes in the vicinity of the grain boundary in detail by HRTEM, most of the grain boundaries are contained in the grain boundary group which is generally classified into a low-angle grain boundary, and are electrically inactive.

Therefore, the grain boundary does not act as trap for carriers, and is regarded as what does not prevent the movement of carriers. In other words, the crystalline silicon film according to this embodiment is regarded as a crystalline semiconductor thin film having a substantially single crystal structure.

Embodiment 4

In this embodiment, a process of manufacturing a TFT different in structure from Embodiment 2 will be described. The description will be given with reference to FIGS. 11A to 11E, but since the manufacturing process is basically identical with that described in Embodiment 2, only differences therebetween will be described in detail.

Figure 11A:
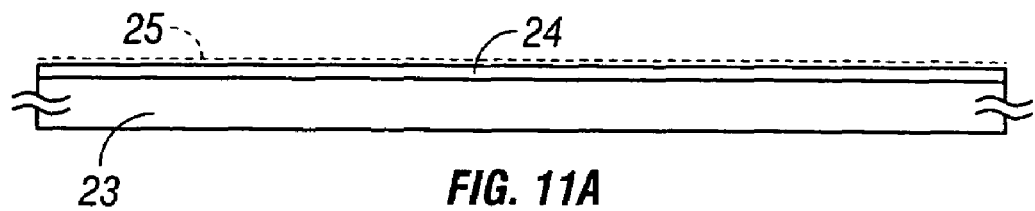
FIGS. 11A to 11E are diagrams showing a process of manufacturing a semiconductor device.

First, as shown in FIG. 11A a substrate 23 having an insulating surface is prepared, and an amorphous semiconductor thin film 24 (an amorphous silicon film is exemplified in this embodiment) is formed through the low pressure CVD method (or plasma CVD method). In case of this embodiment, the substrate 23 having the insulating surface is determined by the highest heating temperature during the process. If the highest temperature is about 650° C. or lower, the glass substrate can be used. However, if the highest temperature is higher than 650° C., a substrate high in heat resistance (silicon substrate, quartz substrate or the like) must be employed.

Then, a catalytic element containing layer 25 is formed on the amorphous silicon film 24. In this embodiment, a case using the first embodiment of Japanese Patent Laid-open Publication No. Hei 7-130652 will be described as crystallizing means. The technique disclosed in the second embodiment in that publication may be used. Also, the usable catalytic elements are described in Embodiment 2 (FIG. 11A).

Figure 11B:

Thereafter, a heat treatment for crystallization is conducted to obtain a polycrystalline silicon film 26. The heat treatment is conducted in an electrothermal furnace at 500 to 700° C. (preferably 550 to 650° C.). Then, a laser beam is irradiated to the polycrystalline silicon film 26 thus obtained, to improve the crystallinity. As a laser light source, a KrF eximer laser, an XeCl eximer laser, a YAG laser or the like may be used. This layer annealing process may be omitted (FIG. 11B).

After the irradiation of a laser beam is completed, a resist mask 27 is formed on the film. Then, a process of doping with elements selected from elements of the Group XV is conducted through the plasma doping method (or ion implanting method). The elements of the Group XV may be N (nitrogen), P(phosphorus), As (arsenic) and Sb (antimony) or Bi (bismuth). In particular, what exhibits remarkable action and effect is phosphorus, and therefore, phosphorus is used in this embodiment.

Also, the doping conditions are set to 20 W in RF power and 5 to 30 KeV in acceleration voltage (representatively, 10 keV), and the dose of P elements is set to $1 \times 10^{13}$ ions/cm$^2$ or more (preferably $5 \times 10^{13}$ to $5 \times 10^{14}$ ions/cm$^2$).

Figure 11C:
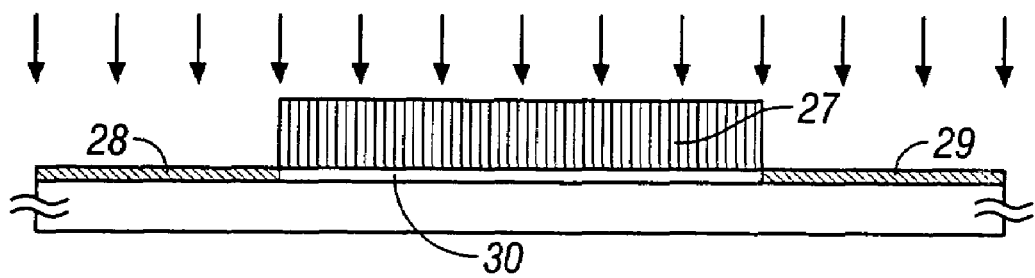

In this way, regions 28 and 29 containing phosphorus with a high concentration are formed. Those regions are called "gettering region". Also, because a region indicated by reference numeral 30 is protected by the resist mask 27, no phosphorus is implanted therein. This region is a region later used as an active layer, and called "gettered region" (FIG. 11C).

Figure 11D:
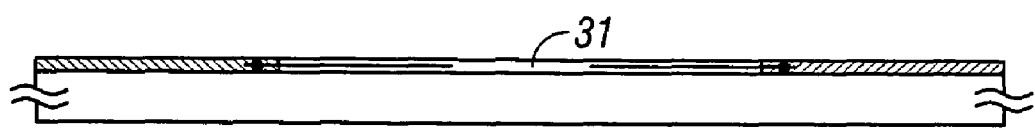

After the phosphorus ion implantation process has been completed, a heat treatment for gettering is conducted after the resist mask 27 has been removed, and catalytic elements remaining in the gettered region 30 are moved to the gettering regions 28 and 29 (a direction indicated by an arrow). In this way, a gettered region 31 reduced in the concentration of the catalytic elements is obtained (FIG. 11D).

In this situation, the heat treatment may be conducted in the electrothermal furnace in an inactive atmosphere, a hydrogen atmosphere, an oxidization atmosphere or an oxidization atmosphere containing halogen elements therein. Also, the temperature may be set to 500 to 1050° C. It should be noted that the upper limit of the temperature is set around a temperature at which the phosphorus is not reversely diffused in the gettered region 31.

In the case of using a glass substrate as the substrate 23, it is preferable that the above heat treatment is conducted at 550 to 650° C. Also, in the case of using a silicon substrate or a quartz substrate high in heat resistance, it is preferable that the heat treatment is conducted at 700 to 950° C.

Figure 11E:
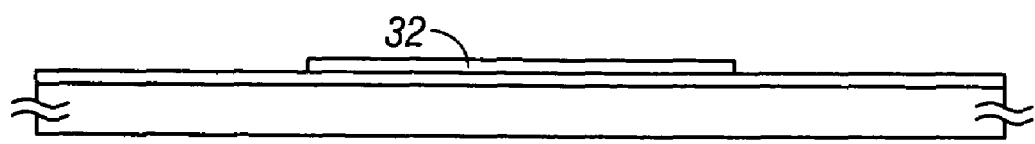

Then, an active layer 32 is formed by patterning. In this situation, the gettering regions 28 and 29 are removed. With this process, the active layer 32 comes to a region in which the concentration of catalytic elements is sufficiently reduced. Since there is an tendency that the catalytic elements exist with a high concentration in the vicinity of the boundaries between the gettered region 31 and the gettering regions 28, 29, it is desirable to remove such boundaries together with the gettering regions 28 and 29 at the time of the patterning (FIG. 11E).

In this way, the same state as that of FIG. 7A showing Embodiment 1 is obtained. Thereafter, the same process as that in Embodiment 1 is conducted to form a pinning region, and a gate electrode and so on are formed, to thereby complete a pinning TFT structured as shown in FIGS. 9A to 9C. The TFT thus manufactured realizes the same pinning effect as described in Embodiment 1.

This embodiment shows an example in which the ion implantation method is utilized in formation of the gettering region. Alternatively, PSG or the like may be used. Also, a heat treatment is conducted in an atmosphere containing elements selected from the elements of the Group XV to enable gettering.

Also, as a result of analyzing the crystalline silicon film manufactured in the manufacturing process according to this embodiment using the technique of HRTEM, electron beam diffraction or the like, it is proved that the crystalline semiconductor thin film the main orientation face of which is {110} face, and has a substantially single crystal structure as in the crystalline semiconductor thin film described in Embodiment 3.

Embodiment 5

In Embodiments 1 to 4, in the case of using Japanese Patent Laid-open Publication No. Hei 7-130652 as means of transforming an amorphous silicon film into a polycrystalline silicon film, whether the technique described in the first embodiment of the publication is employed or the technique of the second embodiment is employed makes difference in the crystal structure of the polycrystalline silicon film.

In the case of employing the first embodiment of that publication, a polycrystalline silicon film is made up of the gathering of irregularly shaped crystal grains. For that reason, the conventional TFT (TFT having no pinning region) suffers from such a problem that a leak current (off-state current) is increased by carriers moving on the grain boundaries.

However, since the pinning TFT according to the present invention has an advantage that the problem such as the leak current that moves on the grain boundary is reduced since the carrier movement path is regulated to substantially one way by the pinning regions formed regardless of the grain boundary.

Figure 12A:
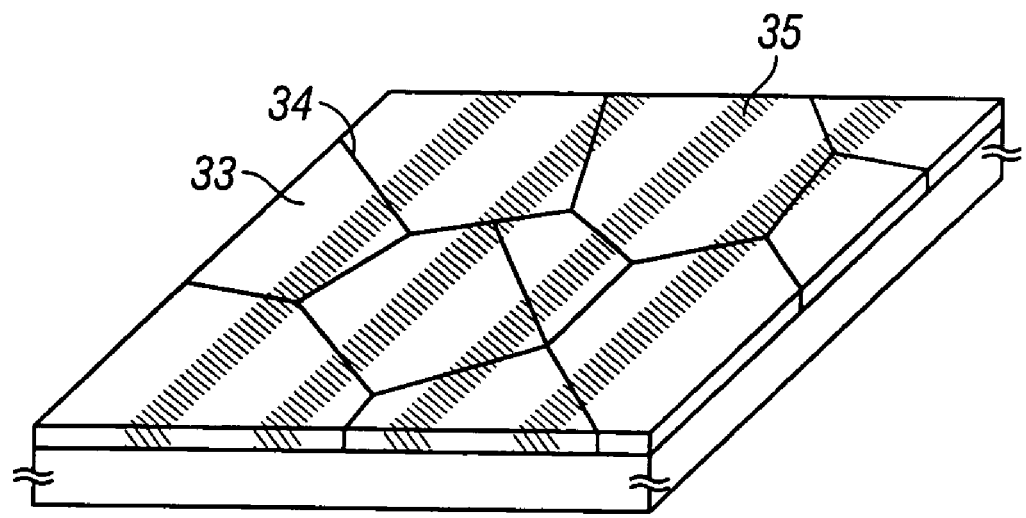
FIGS. 12A and 12B are diagrams showing a relation between a pinning region and a grain boundary.

FIG. 12A shows an example in which a pinning region is formed in a crystalline silicon film which is crystallized by the means described in the first embodiment of the above publication. Reference numeral 33 denotes a crystal grain, 34 is a grain boundary, and 35 is a pinning region.

Also, in the case of using the second embodiment of the above publication, it is confirmed under observation by TEM (transmission type electron microscope) from the micro viewpoint that the crystalline silicon film has a crystal structure in which a plurality of bar-shaped or flat bar-shaped crystals are arranged substantially in parallel with each other with regularity in a specific direction.

Figure 12B:
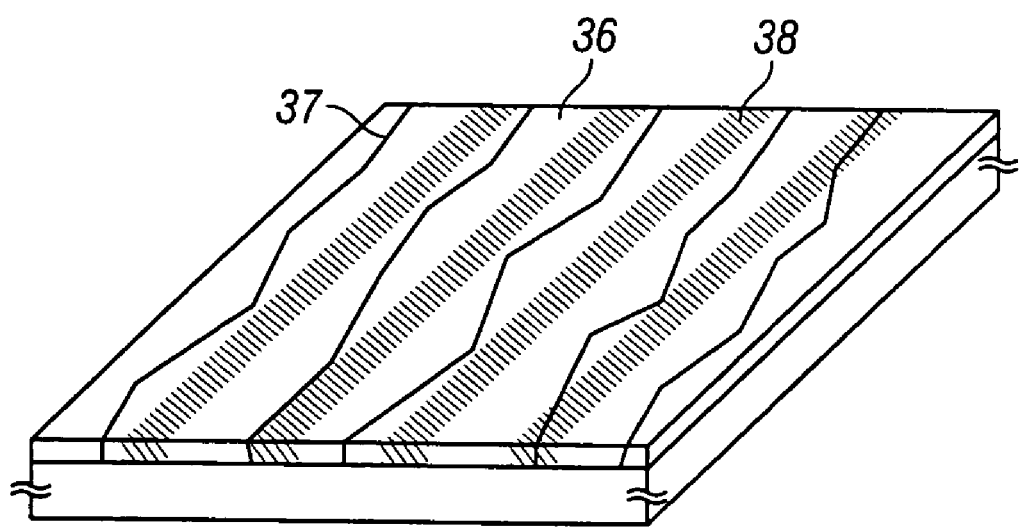

In FIG. 12B, reference numeral 36 denotes a bar-shape or flat bar-shape crystal, 37 is a grain boundary, and 38 is a pinning region. In this situation, the pinning region may be formed so as to be overlapped with the gain boundary, or may be formed substantially in parallel with the grain boundary. For example, it may be structured such that one to several grain boundaries exist between two arbitrary pinning regions.

Also, as occasions demand, it may be structured so that a pinning region is disposed perpendicularly to a direction along which the grain boundary extends. In this case, although the on-state current is lowered, the low off-state current characteristic can be realized.

Also, it is confirmed under experiment by the present inventors that the crystallinity is greatly improved by also subjecting the crystalline silicon film having any one of the above two crystal structures shown in FIGS. 12A and 12B to the gettering process of the catalytic elements as shown in Embodiments 2 and 3.

According to the analysis of the present inventors, it is presumed that the crystalline silicon film of this type is electrically inactive in grain boundary and acts as a mere energy barrier. Accordingly, in particular, in the case where the technique of Embodiment 3 or 4 of the present specification is applied to the technique disclosed in the second embodiment of Japanese Patent Laid-open Publication No. Hei 130652, it is presumed that the grain boundary per se achieves the function similar to the pinning region of the present invention.

In this case, the grain boundary of the crystal grains which are arranged in parallel with each other and with regularity in a specific direction corresponds to the pinning region 104 of FIG. 1A, and the crystal grains correspond to the channel forming region 105. However, the effect as a barrier that regulates the carrier movement path is smaller than that of the pinning region, and carriers of some degree move across the barrier (grain boundary). Therefore, the pinning effect can be more effectively obtained if the pinning region is disposed so as to coincide with the direction along which the grain boundary extends.

This embodiment can be applied to all of the semiconductor devices described in Embodiments 2 to 4. Also, this embodiment can be combined with all other embodiments.

Embodiment 6

In a pinning TFT described in Embodiment 2, a metal thin film made of aluminum or mainly containing aluminum is used as a gate electrode, but a silicon gate electrode having one conductivity can be used.

In the case of using the silicon gate electrode, since an upper limit temperature in the heat treatment after forming the gate electrode can be raised, the margin in the TFT manufacturing process is improved, thereby being capable of expecting an improvement in through-put and the characteristic improvement effect.

This embodiment can be applied to all of the semiconductor devices described in Embodiments 2 to 4. Also, this embodiment can be combined with all other embodiments.

Embodiment 7

In this embodiment, a description will be given of an example of gettering catalytic elements that promote the crystallization in the source/drain region using the gettering effect of phosphorus on the metal elements as described in Embodiment 4.

First, the process described in Embodiment 2 is conducted to obtain a state shown in FIG. 8C. In this state, a source region 714 and a drain region 715 include phosphorus with a high concentration. Then, in this state, a heat treatment is conducted at 400 to 650° C. (preferably 450 to 500° C.), and the catalytic elements remaining in an active region 718 is gettered to the source region 714 and the drain region 715.

The reason that the heat treatment temperature is set to 400 to 650° C. is because the heat resistance of a metal thin film mainly containing aluminum to be used as a gate electrode is taken into consideration. Therefore, in the case of using silicon gate as the gate electrode as described in Embodiment 7, the heat treatment temperature can be set to 600 to 1050° C. (preferably 700 to 950° C.).

Also, in case of a P-channel pinning TFT, a high-concentration boron or indium is added to the source/drain region. The catalytic elements cannot be gettered by only boron or indium.

However, according to the experiment by the present inventors, it is proved that an excellent gettering effect can be exhibited in a state where phosphorus of some degree (dose is about $5\times10^{14}$ atoms/cm$^2$) and boron of the concentration exceeding the concentration of phosphorus (dose is about $1\times10^{15}$ to $1.5\times10^{15}$ atoms/cm$^2$) are mixed together. Using this phenomenon, the catalytic elements can be gettered in the source/drain region even in the P-channel pinning TFT.

This embodiment can be applied to all of the semiconductor devices described in Embodiments 2 to 4. Also, this embodiment can be combined with all other embodiments.

Embodiment 8

Embodiments 1 to 8 show examples in which a crystalline silicon film (a polycrystalline silicon film or a substantially single crystalline silicon film) is used as the active layer. However, the crystalline semiconductor thin film applicable to the present invention is not limited to the crystalline silicon film.

First, in a pinning TFT according to the present invention, at least a part of an active region can be formed of a compound semiconductor film or of a lamination structure consisting of a compound semiconductor film and a crystalline silicon film.

For example, as the compound semiconductor film, there may be used a thin film made of a gallium arsenic (GaAs), indium phosphorus (InP) or silicon germanium ($Si_xGe_{1-x}$: where x is 0.5 to 9.5) or the like.

In particular, in the case of using the compound semiconductor film indicated by $Si_xGe_{1-x}$ as an active region, a carrier mobility higher than that of the crystalline silicon film can be obtained. In other words, with the combination of this effect with the effect of the present invention, a semiconductor device having still higher mobility can be realized.

This embodiment can be applied to all of the semiconductor devices described in Embodiments 2 to 4. Also, this embodiment can be combined with all other embodiments.

Embodiment 9

In this embodiment, a description will be given of an example in which a structure for preventing a substrate floating effect is added to a pinning TFT of the present invention. The substrate floating effect is a phenomenon in which minority carriers produced by collision ionization are stored under a channel, and a parasitic bipolar transistor is rendered conductively to drop a withstand voltage between a source and a drain.

In order to solve this problem, in this embodiment, the arrangement of the pinning region is structured as shown in FIG. 13. Since the basic structure is identical with that of FIG. 1A, reference marks are added to only necessary parts and will be described. Also, the substrate floating effect does not cause a serious problem in a P-channel type but does cause a remarkable problem in a N-channel type. For that reason, in this embodiment, the N-channel pinning TFT is exemplified and will be described.

In case of a pinning TFT structured as shown in FIG. 13, minority carriers (holes) produced by collision ionization flow in a pinning region 39 and reaches to a source region 40 as they are. If an external terminal is connected to the pinning region 39 to draw out the holes, the storage of the holes can be prevented. As the external terminal, a source electrode which is in contact with the source region 40 may be used, for example, by a contact hole indicated by reference numeral 41.

In this way, the pinning region of the present invention functions as a path for permitting the minority carriers (holes) produced by collision ionization to flow in a reverse direction to the majority carriers (electrons) and drawing them out to the exterior as they are.

In case of this embodiment, because the pinning region 39 has a p-type conductivity, the holes can be moved but no electrons are moved. That is, electrons which are majority carriers flow in only the channel forming region 42.

Because the structure of this embodiment makes it possible to prevent the substrate floating effect, a semiconductor device very high in withstand voltage and high in reliability can be realized by the synergistic effect with the effect of preventing a drop of the withstand voltage due to punch-through as described in Embodiment 1.

It is needless to say that as the countermeasure to the substrate floating effect, other known techniques (representatively, a technique in which germanium is added to the source region to form a potential well, etc.) may be utilized, or the combination of those known techniques may be used.

This embodiment can be applied to all of the semiconductor devices described in Embodiments 2 to 4. Also, this embodiment can be combined with all other embodiments.

Embodiment 10

In this embodiment, a description will be given of an example of forming an active region different in structure from Embodiment 1. In particular, there is described an example in which impurity elements for controlling a threshold value voltage are added to a region other than the pinning region in an active region. Although the description will be given with reference to FIG. 14, since the basic structure is substantially identical with that of FIG. 1A described in Embodiment 1, reference marks are added to only necessary parts and will be described.

In FIG. 14, reference numeral 43 denotes a source region; 44 is a drain region; and 45 is a channel forming region. Then, reference numeral 46 to 48 are impurity regions (pinning regions) having the conductive type reverse to that of the source/drain regions 43 and 44.

The feature of this embodiment resides in that impurity regions 49 and 50 for controlling a threshold value voltage are disposed in a region other than the pinning regions 46 to 48. The impurity regions 49 and 50 for controlling the threshold value voltage are impurity regions having one conductive type identical with that of the source/drain regions 43 and 44.

In FIG. 14, the impurity regions 49 and 50 for controlling the threshold value voltage are disposed so as to be in contact with both of the source/drain regions 43 and 44. Alternatively, they may be disposed so as to be in contact with any one of the source/drain regions, or they may be disposed so as not to be contact with both of the source/drain regions.

By the way, in general, there is a case where the threshold value voltage of the TFT is shifted in any one of positive and negative directions by a difference in work function between the active region and the gate electrode, or by the thickness of the gate insulating film, etc. A variation in the threshold value voltage causes a serious problem because the variation largely contributes to setting of the operation voltage when the semiconductor circuit is structured by TFTs.

The pinning TFT according to the present invention is characterized in that the threshold value voltage can be controlled by the effect of the impurity elements added to the pinning region and the narrow channel effect controlled by the pinning region. However, in the case where the shift of the threshold value voltage due to the difference in the work function is large, etc, there is a case in which it is difficult to control the threshold value voltage by only the above manner.

In such a case, the feature of the pinning TFT according to this embodiment is that a desired threshold value voltage is forcedly realized by the impurity regions 49 and 50 for controlling the threshold value voltage which are intentionally and locally disposed.

In the case of moving the threshold value voltage in a positive direction, the impurity regions 49 and 50 for controlling the threshold value voltage may be made of elements selected from the Group XIII (representatively boron or indium). In case of the N-channel pinning TFT, such elements are unnecessary since the pinning regions have the same function.

Also, in the case of moving the threshold value voltage in a negative direction, the impurity regions 49 and 50 for controlling the threshold value voltage may be made of elements selected from the Group XV (representatively phosphorus or arsenic). In case of the P-channel pinning TFT, such elements are unnecessary since the pinning regions have the same function.

Since the impurity regions 49 and 50 for controlling the threshold value voltage do not function as an energy barrier for majority carriers, regions 49 and 50 function as a majority-carrier movement path. For that reason, it is assumed that the impurity regions 49 and 50 for controlling the threshold value voltage do not narrow the effective channel width.

This embodiment can be applied to all of the semiconductor devices described in Embodiments 2 to 4. Also, this embodiment can be combined with all other embodiments.

Embodiment 11

In Embodiment 5, a relation between the arrangement of the pinning region and the grain boundary is described. In this embodiment, a specific case of Embodiment 5 will be described. This embodiment is a technique in which the effect is exhibited particularly in an N-channel TFT.

As described in Embodiment 1, since the pinning TFT according to the present invention can prevent the lowering of the mobility due to the scattering of impurities, it is assumed that the mobility is substantially decided by only lattice scattering represented by Expression 4. This embodiment shows a structure in which the effective mass (m*) of carriers is reduced as much as possible in Expression 4 (resultantly $\mu_{total}$ becomes large).

According to the literature, it is reported that when the electron moving direction coincides with the orientation <100> of silicon crystal, the effective mass of electrons becomes the smallest. This phenomenon remarkably is exhibited particularly at an extremely low temperature such as 4 K (kelvin).

FIG. 15A shows a crystalline silicon film formed on a substrate having an insulating surface, using a technique disclosed in Japanese Patent Laid-open Publication No. Hei 8-78329. The crystalline silicon film is formed by the combination of the technique disclosed in the above publication with Embodiment 2 (or Embodiment 3).

The crystalline silicon film obtained by the above means is characterized in that a face {110} is a main orientation face. Also, the growth direction of the individual bar-shaped or flat-bar-shaped crystal 51 that constitutes the crystalline silicon film is substantially identical with an axial direction <111>. Those results are confirmed from the electron diffraction pattern. This appearance is shown in FIG. 15B.

As shown in FIG. 15B, in the case where the crystal face is a face {110}, an axis <111> and an axis <100> exist in the face. This embodiment is characterized in that, in order to utilize the effects reported in the above literature, the pinning regions 52 are formed with an arrangement shown in FIG. 15A.

In other words, although carriers (electrons are exemplified) are normally moved along the grain boundaries 53 toward the axis <111>, in this embodiment, the pinning regions 52 are formed so as to substantially coincide with the axis <100>, to thereby make the electron progressing direction forcibly coincide with the axis <100>. With this arrangement, since the effective mass of electrons is reduced so that lattice scattering can be reduced, the entire mobility is improved.

This embodiment can be applied to all of the semiconductor devices described in Embodiments 2 to 4. Also, this embodiment can be combined with all other embodiments.

Embodiment 12

According to the methods of manufacturing the semiconductor device described in Embodiments 2 to 4, the N-channel pinning TFT and the P-channel pinning TFT can be manufactured. Therefore, a CMOS circuit (invertor circuit) into which the N-channel pinning TFT and the P-channel pinning TFT are complementally combined can be structured following in the known CMOS technique.

Figure 16A:
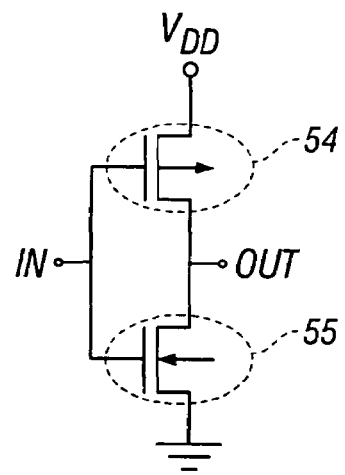
Figure 16A:
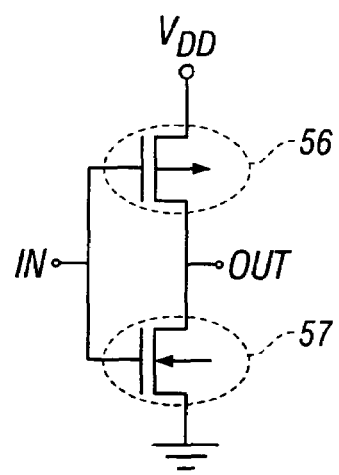
Figure 16C:
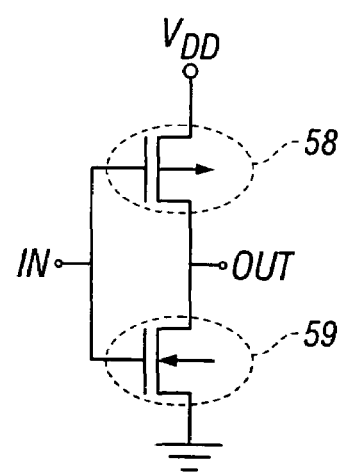

In this case, the CMOS circuit can be structured as shown in FIGS. 16A, 16B and 16C. In FIG. 16A, the CMOS structure is formed of two pinning TFTs 54 and 55, in which the upper stage represents the P-channel pinning TFT and the lower stage represents the N-channel pinning type.

Also, in FIG. 16B, a TFT (channel doped TFT) 56 using a conventional channel doping is used for the P-channel type, and a pinning TFT 57 is used for the N-channel type. Also, in FIG. 16C, a pinning TFT 58 is used for the P-channel type contrary to FIG. 16B, and a channel doped TFT 59 is used for the P-channel type.

Normally, since the N-channel type is higher in mobility than the P-channel type, the structure shown in FIG. 16B is preferable because the outputs of the N-channel TFT and the P-channel TFT are balanced.

Also, all other embodiments are applicable to the CMOS semiconductor device of this embodiment. Also, other embodiments are applicable thereto for only any one of the N-channel pinning TFT and the P-channel pinning TFT.

Embodiment 13

Embodiment 1 shows an example in which elements selected from the Group XIII or XV are added to the pinning region. Instead, C (carbon), N (nitrogen) or O (oxygen) may be used.

In the case of using any elements of C, N and O, the energy band width of the crystalline semiconductor thin film is extended as a result of which a high barrier is formed. For that reason, the case is characterized in that it is commonly used for both of the N-channel type and the P-channel type.

Also, it is preferable that the concentration of added elements is set to $1\times10^{17}$ to $1\times10^{20}$ atoms/cm$^3$ (representatively, $1\times10^{18}$ to $1\times10^{19}$ atoms/cm$^3$). In this case, the pinning region per se has no capacity of shifting the threshold value voltage, but it is possible to control the threshold value voltage using the narrow channel effect.

Embodiment 14

In this embodiment, a description will be given of an example in which the configuration of the pinning region is in the form of a dot pattern in the structure of FIG. 1A described in Embodiment 1. Although the description will be given with reference to FIG. 17, the same marks as those in FIG. 1A are employed for parts other than necessary parts.

Figure 17:
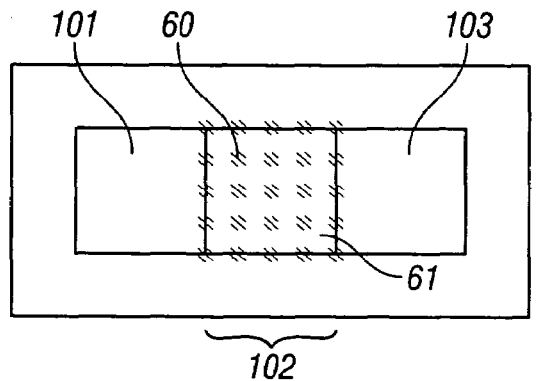
FIG. 17 is a diagram for explanation of the structure of an active region.

As shown in FIG. 17, pinning regions 60 of this embodiment are formed in dot patterns (dot-shaped). Also, a channel forming region 61 is formed so as to surround those pinning regions 60. The configuration of the pinning region 60 is not limited to circle but may be formed in an oval shape, a bar shape, etc. Also, the arrangement of the individual pinning regions may be shifted in a zigzag manner.

Embodiment 15

In the process of manufacturing a pinning TFT described in Embodiment 2, it is also effective that impurity elements having the same conductive type as that of the pinning regions are added to the surface (upper surface) of an underlayer film 702 shown in FIG. 7A.

In this case, in the energy state described in FIG. 5, the energy state of a channel forming region 503 is raised from its bottom. With this structure, since the carrier scattering on the boundary between the underlayer film and an active region is reduced, this greatly contributes to an improvement in mobility.

The structure of this embodiment is a technique conducted on an insulating layer which is an under layer of the polycrystalline silicon film that constitutes an active layer. Accordingly, this structure can be applied to the pinning TFT of any structures.

Embodiment 16

The present invention is applicable to not only a top gate type TFT (representatively, a planer type TFT) but also a bottom gate type TFT (representatively, a reverse stagger type TFT).

Also, in the case where the present invention is applied to the bottom gate type TFT, the structure of this embodiment can be combined with the structure of other embodiments.

Embodiment 17

In this embodiment, a description will be given of an example in which an electro-optic device is structured using a pinning TFT of the present invention. The electro-optic device is defined as a device that converts an electric signal into an optical signal or a device that converts the optical signal into the electric signal. The electro-optic device may be selected from an active matrix liquid crystal display device, an EL (electro luminescence) display device, an EC (electro chlomics) display device, etc. Also, an image sensor or CCD can be manufactured.

Figure 18:
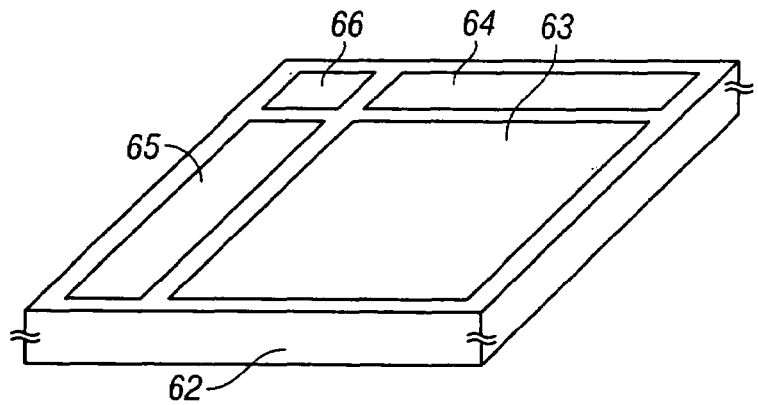
FIG. 18 is a diagram showing the outline of an electro-optic device.

What is shown in FIG. 18 is an example of an arrangement of a part (TFT formation side substrate) of a liquid crystal module. Reference numeral 62 denotes a substrate having an insulating surface; 63 is a pixel matrix circuit; 64 is a source side drive circuit; 65 is a gate side drive circuit; and 66 is a logic circuit.

The source side drive circuit 64 is mainly made up of a shift register circuit, a sampling circuit, a buffer circuit, etc. Also, the gate side drive circuit 65 is mainly made up of a shift register circuit, a buffer circuit, etc. The logic circuit 66 is made up of various signal processing circuits such as a clock generator circuit, a memory circuit, an arithmetic operating circuit, a signal convertor circuit, etc.

The pinning TFT of the present invention is applicable to all of the above circuits. Also, it can be partially applied to those circuits according to a required performance. For example, it is effective to apply the pinning TFT to the circuit (the logic circuit, the shift register circuit, etc.) that requires a high-speed operation characteristic. Also, it is effective that the pinning TFT is applied to a pixel matrix circuit that requires a high withstand voltage characteristic.

On the other hand, there is no advantage obtained by using the pinning TFT with respect to a circuit that requires a large current such as a buffer circuit or a sampling circuit. Since the pinning TFT of the present invention is narrowed in effective channel width as large as the pinning regions, it is difficult to produce the on-state current in comparison with the conventional TFT of the same size.

Accordingly, a system is preferable in which the TFT using the conventional channel doping is used for a circuit that requires a large current, and the pinning TFT of the present invention is used for a circuit that attaches importance to the high-speed operability and the high withstand voltage without using a large current.

Embodiment 18

The pinning TFT of the present invention makes it possible to constitute not only the electro-optic device described in Embodiment 17 but also a semiconductor circuit such as a logic IC or a logic LSI. In particular, the pinning TFT described in Embodiment 3 or 4 realizes the performance equal to that of the conventional MOSFET. The semiconductor circuit is defined as an electric circuit that conducts the control or conversion of an electric signal using the semiconductor characteristic.

Also, the pinning TFT of the present invention is applicable to a circuit using a high frequency such as an input/output signal control circuit of a portable telephone, in particular, an MMIC (microwave module IC), etc.

It is needless to say that a structure may be made such that the TFT using the conventional channel doping is employed for a portion that needs to use a large current as in Embodiment 17, and the pinning TFT of the present invention is used for a portion that requires the high-speed operation performance and the high withstand voltage performance.

As described above, since the pinning TFT of the present invention is a TFT that satisfies the high-speed operation performance and the high withstand voltage characteristic (high reliability) together, it can be applied to any semiconductor circuits.

Embodiment 19

The electro-optic device or the semiconductor circuit structured using the pinning TFT of the present invention is employed as structural components of various electronic devices. The electronic device described in this embodiment is defined as a product equipped with a semiconductor circuit or an electro-optic device.

The electronic device of this type may be a video camera, a still camera, a projector, a head mount display, a car navigation, a personal computer, a portable information terminal (a mobile computer, a portable telephone, etc.). Examples of those devices are shown in FIGS. 19A to 19F.

Figure 19A:
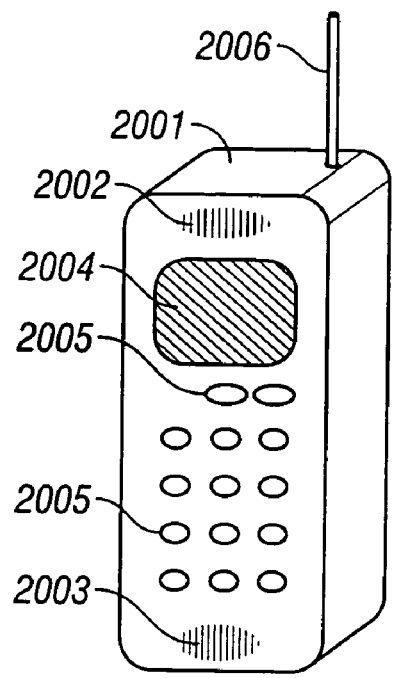

FIG. 19A shows a portable telephone which is made up of a main body 2001, a voice output section 2002, a voice input section 2003, a display device 2004, an operation switch 2005, and an antenna 2006. The present invention can be applied to the voice output section 2002, the voice input section 2003, the display device 2004 and so on.

Figure 19B:
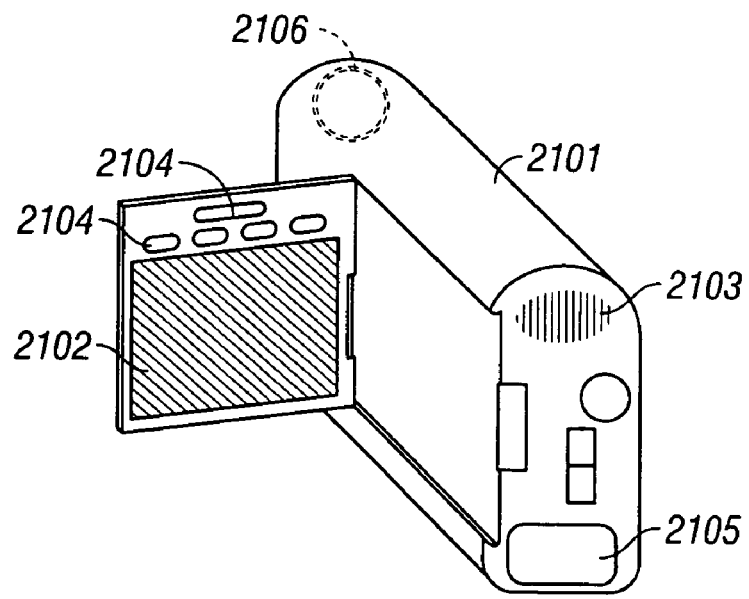

FIG. 19B shows a video camera which is made up of a main body 2101, a display device 2102, a voice input section 2103, an operation switch 2104, a battery 2105, and a receiver 2106. The present invention can be applied to the display device 2102, the voice input section 2103, the receiver 2106, etc.

FIG. 19C shows a mobile computer which is made up of a main body 2201, a camera section 2202, a receiver 2203, an operation switch 2204, and a display device 2205. The present invention can be applied to the camera section 2202, the receiver 2203, the display device 2205, etc.

FIG. 19D shows a head mount display which is made up of a main body 2301, a display device 2302, and a band section 2303. The present invention can be applied to the display device 2302.

FIG. 19E shows a rear type projector which is made up of a main body 2401, a light source 2402, a display device 2403, a polarization beam splitter 2404, reflectors 2405 and 2406, and a screen 2407. The present invention can be applied to the display device 2403.

FIG. 19F shows a front type projector which is made up of a main body 2501, a light source 2502, a display device 2503, an optical system 2504, and a screen 2505. The present invention can be applied to the display device 2503.

As described above, an applicable range of the present invention is applied is remarkably wide so as to be applicable to electronic devices in any fields. Also, the present invention can be applied to all of products if they require the electro-optic device of Embodiment 16 and a semiconductor circuit of Embodiment 17.

As is described above, according to the present invention, even in a fine semiconductor device extremely small in channel length and channel width, an adverse affect of the short-channel effect can be suppressed or prevented. That is, a drop of the withstand voltage between the source and drain and a drop of a threshold value voltage due to punch-through can be eliminated together.

Also, since the above effect is obtained without permitting excessive impurities to be contained in the channel forming region (a region in which carriers move), carrier mobility is not deteriorated. This leads to an advantage that a very high mobility is realized, and the high-speed operation characteristic (high-frequency characteristic) is excellent.

Further, since the pinning regions formed in the channel forming region is utilized as wiring for extracting minority carriers, a drop of the withstand voltage between the source and the drain due to collision ionization can be prevented.

With the above synergistic effect, a semiconductor device that realizes the high-operation performance and the high reliability together can be realized. Also, the electro-optic device, the semiconductor circuit and the electronic device equipped with those device and circuit to which the semiconductor device of the present invention is applied can obtain a very high performance and a high reliability.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing a semiconductor device, comprising the steps of:
    forming a crystalline semiconductor film over an insulating surface; and
    adding impurity elements that shift an energy band of said crystalline semiconductor film to a portion of said crystalline semiconductor film which will come to an active region later to locally form an impurity region;
    wherein said impurity region is formed so as to extend between a source region and a drain region, and at least two channel regions are separated from each other by said impurity region;
    wherein said impurity region is substantially in parallel with a grain boundary in said crystalline semiconductor film, and
    wherein said grain boundary extends from the source region to the drain region.

2. A method according to claim 1, wherein said crystalline semiconductor film forming step comprises the steps of:
    forming an amorphous semiconductor film over said insulating surface;
    holding catalytic elements that promote the crystallization of said amorphous semiconductor film on said amorphous semiconductor film;
    crystallizing said amorphous semiconductor film through a heat treatment to transform said amorphous semiconductor film into a crystalline semiconductor film; and
    gettering said catalytic elements remaining in said crystalline semiconductor film to a processing atmosphere through a heat treatment in an atmosphere containing halogen elements therein.

3. A method according to claim 1, wherein said crystalline semiconductor film forming step comprises the steps of:
    forming an amorphous semiconductor film on an insulating surface;
    holding catalytic elements that promote the crystallization of said amorphous semiconductor film on said amorphous semiconductor film;
    crystallizing said amorphous semiconductor film through a heat treatment to transform said amorphous semiconductor film into a crystalline semiconductor film; and
    introducing elements selected from the group XV into a predetermined region of said crystalline semiconductor film; and
    gettering said catalytic elements in said crystalline semiconductor film into which said elements selected from the group XV through a heat treatment.

4. A method according to claim 1, wherein elements selected from the group XIII are added to said impurity region with the concentration of $1\times10^{17}$ to $1\times10^{20}$ atoms/cm$^3$.

5. A method according to claim 4, wherein the elements selected from the group XIII comprise one of boron and indium.

6. A method according to claim 1, wherein elements selected from the group XV are added to said impurity region with the concentration of $1\times10^{17}$ to $1\times10^{20}$ atoms/cm$^3$.

7. A method according to claim 6, wherein the elements selected from the group XV comprise one of phosphorous, arsenic and antimony.

8. A method according to claim 1, wherein said crystalline semiconductor film has a polycrystalline structure or a substantially monocrystalline structure.

9. A method according to claim 8, wherein a main orientation face of said crystalline semiconductor film having a substantially monocrystalline structure is a {110} face.

10. A method according to claim 1, wherein said crystalline semiconductor film is obtained by crystallizing an amorphous semiconductor film.

11. A method according to claim 2, wherein said catalytic elements are one or plural kinds of elements selected from the group consisting of Ni, Co, Fe, Pd, Pt, Cu, Au, Ge, Pb and In.

12. A method according to claim 1, wherein said impurity region is formed through the ion implanting method.

13. A method of manufacturing a semiconductor device, comprising the steps of:
    forming a semiconductor film comprising amorphous silicon on an insulating surface;
    providing a metal containing material in contact with said semiconductor film for promoting crystallization;
    crystallizing said semiconductor film;
    adding a first impurity into a portion of the crystallized semiconductor film to form a pinning region; and
    adding a second impurity into the crystallized semiconductor film to form a source region and a drain region, wherein said pinning region extends between the source region and the drain region and at least two channel regions are separated from each other by said pinning region;
    wherein said pinning region is substantially in parallel with a grain boundary in the crystallized semiconductor film; and
    wherein said grain boundary extends from the source region to the drain region.

14. A method of manufacturing a semiconductor device, comprising the steps of:
    forming a crystalline semiconductor film over an insulating surface;
    adding a first impurity into a portion of the crystalline semiconductor film to form a pinning region; and
    adding a second impurity into the crystalline semiconductor film to form a source region and a drain region, wherein said pinning region extends between the source region and the drain region and at least two channel regions are separated from each other by said pinning region;
    wherein said pinning region is substantially in parallel with a grain boundary in the crystalline semiconductor film; and
    wherein said grain boundary extends from the source region to the drain region.

* * * * *